United States Patent
Kawabata et al.

(10) Patent No.: US 7,417,320 B2
(45) Date of Patent: Aug. 26, 2008

(54) SUBSTRATE STRUCTURE AND MANUFACTURING METHOD OF THE SAME

(75) Inventors: Akio Kawabata, Kawasaki (JP); Mizuhisa Nihei, Kawasaki (JP); Masahiro Horibe, Tsukuba (JP); Shintaro Sato, Kawasaki (JP); Daiyu Kondo, Kawasaki (JP); Yuji Awano, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 95 days.

(21) Appl. No.: 11/180,584

(22) Filed: Jul. 14, 2005

(65) Prior Publication Data

US 2006/0290003 A1 Dec. 28, 2006

(30) Foreign Application Priority Data

Aug. 31, 2004 (JP) .............................. 2004-252752
Mar. 30, 2005 (JP) .............................. 2005-098875

(51) Int. Cl.
*H01L 23/48* (2006.01)
*H01L 23/52* (2006.01)
*H01L 29/40* (2006.01)

(52) U.S. Cl. .................. 257/774; 257/E51.04; 977/743
(58) Field of Classification Search ............. 257/E51.04
See application file for complete search history.

(56) References Cited

U.S. PATENT DOCUMENTS

| | | | | | |
|---|---|---|---|---|---|
| 6,232,706 | B1 * | 5/2001 | Dai et al. | ..................... | 313/309 |
| 6,514,113 | B1 * | 2/2003 | Lee et al. | ..................... | 445/50 |
| 6,764,874 | B1 * | 7/2004 | Zhang et al. | ................. | 438/99 |
| 7,201,627 | B2 * | 4/2007 | Ohnuma | ..................... | 445/50 |
| 2003/0211724 | A1 * | 11/2003 | Haase | ..................... | 438/629 |
| 2005/0079659 | A1 * | 4/2005 | Duan et al. | ................. | 438/197 |

FOREIGN PATENT DOCUMENTS

| | | |
|---|---|---|
| JP | 2002-115071 | 4/2002 |
| JP | 2002-530805 | 9/2002 |
| JP | 2003-504857 | 2/2003 |
| JP | 2003-221396 | 8/2003 |
| JP | 2004-67413 | 3/2004 |

* cited by examiner

*Primary Examiner*—Evan Pert
*Assistant Examiner*—Ben P Sandvik
(74) *Attorney, Agent, or Firm*—Kratz, Quintos & Hanson, LLP.

(57) ABSTRACT

A Ti film is pattern-formed on a desired portion on a silicon substrate, and a Co film is formed on the substrate so as to cover the Ti film. CNTs are formed only on a portion, under which the Ti film is formed, of the surface of the Co film at approximately 600° C. by a thermal CVD method. The length of the CNT can be controlled by adjusting the thickness of the Ti film.

13 Claims, 25 Drawing Sheets

(GROWTH TIME:10 MINUTES, Co:2.5nm IN COMMON)

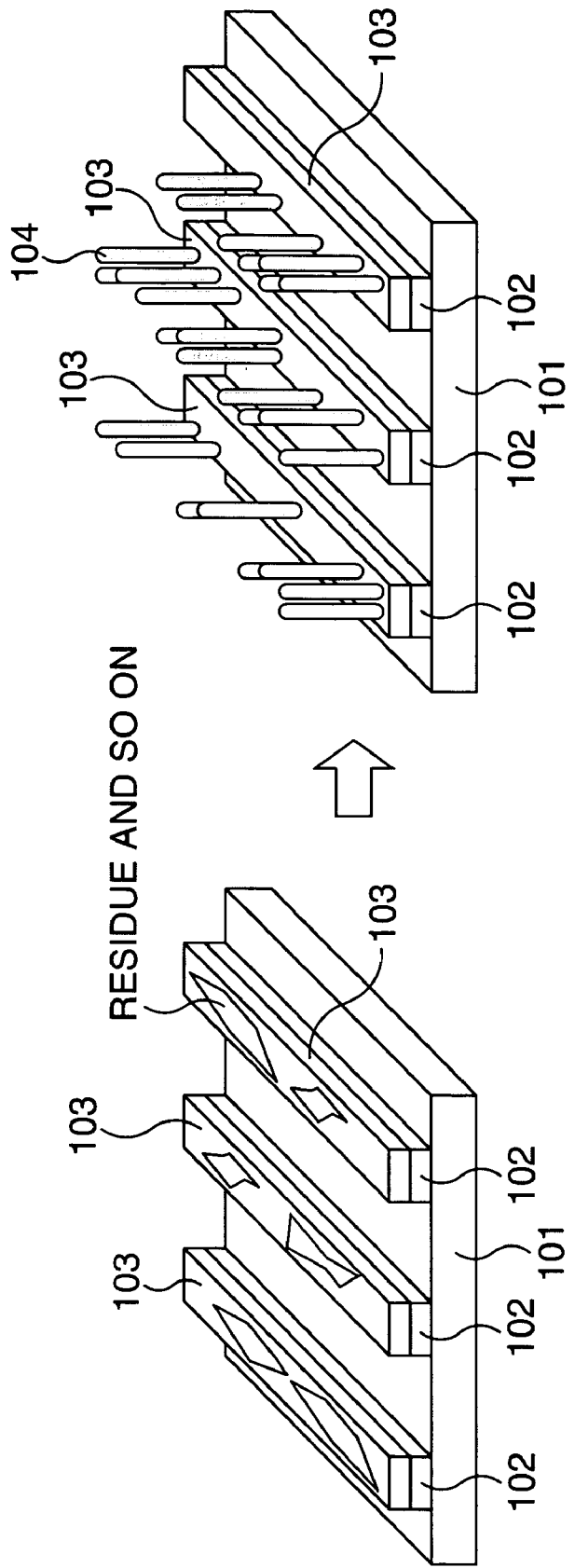

FIG. 8A
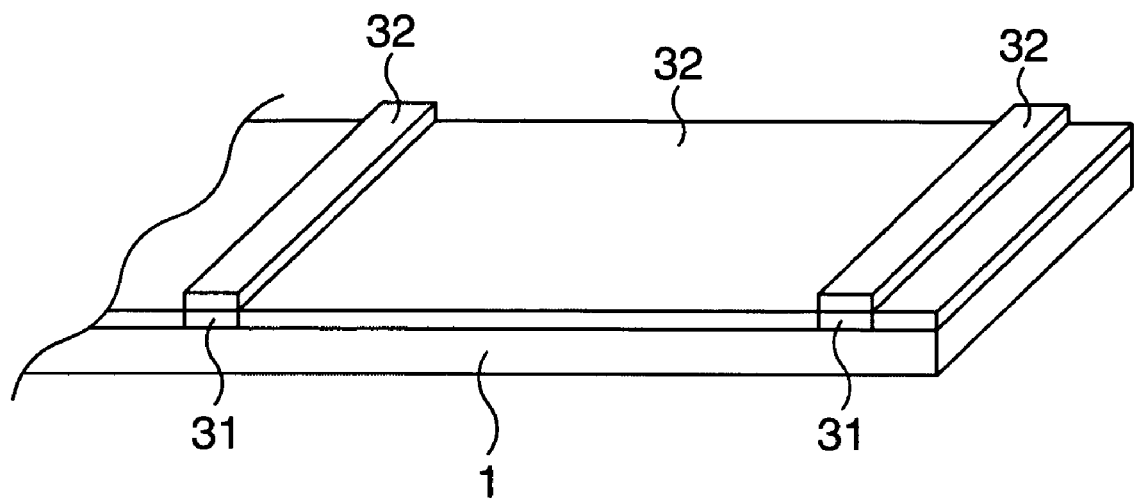
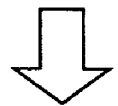
FIG. 8B
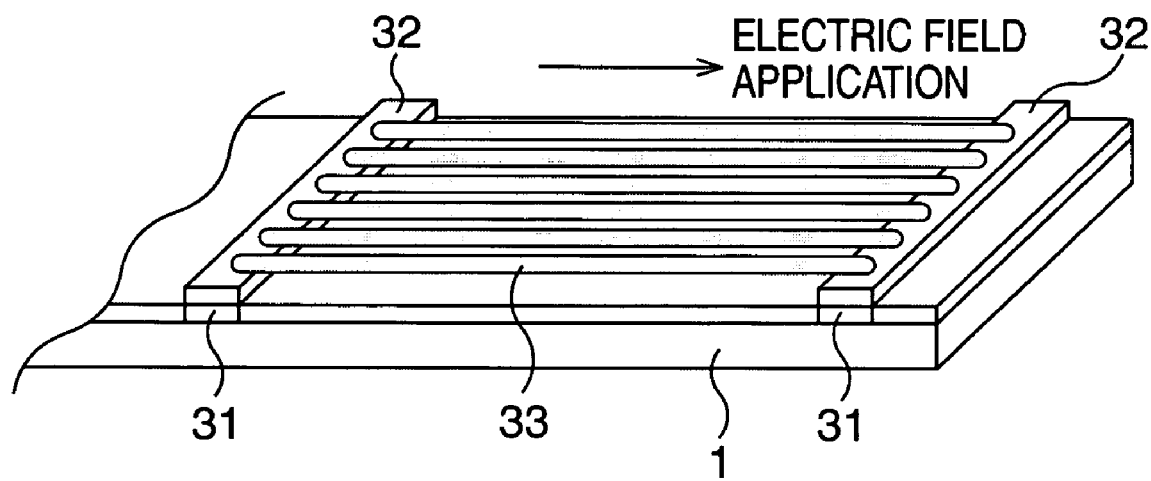

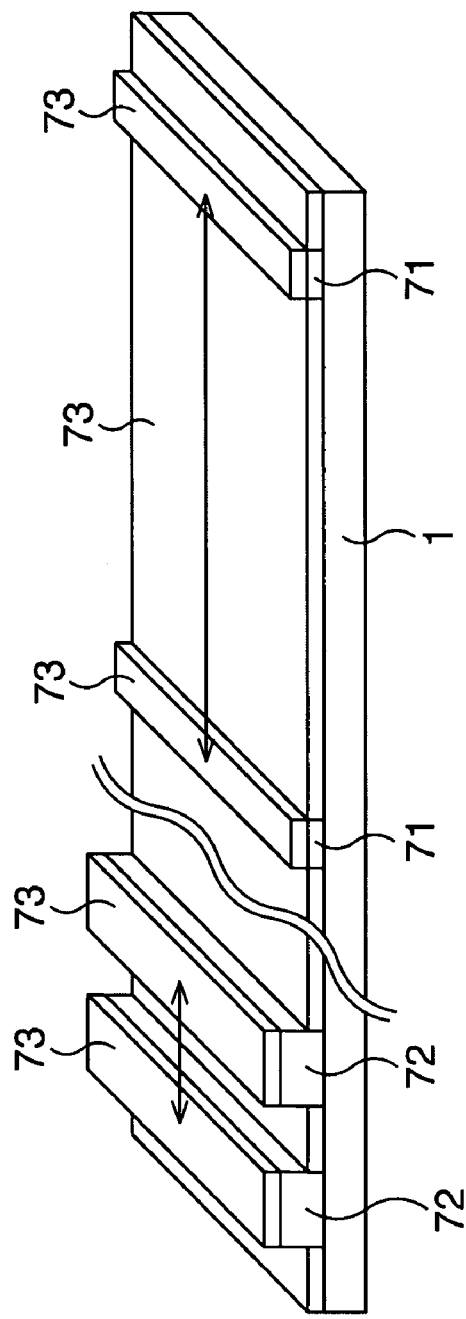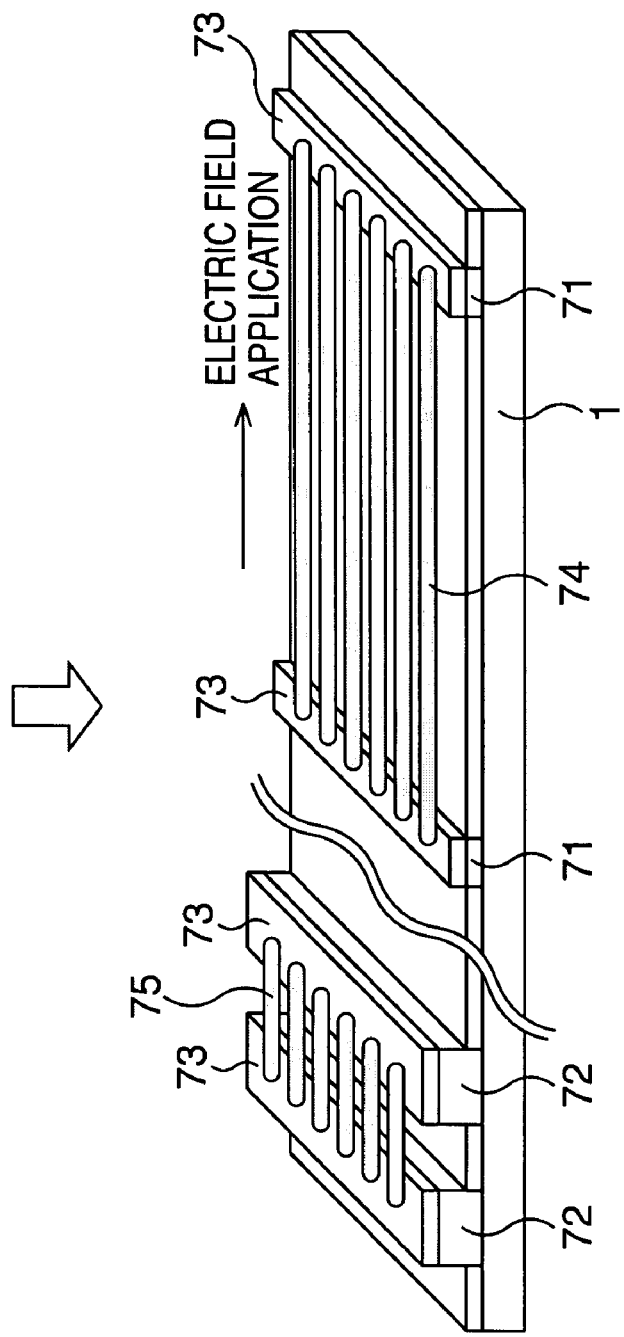
FIG. 11A
FIG. 11B

SUBSTRATE STRUCTURE AND MANUFACTURING METHOD OF THE SAME

CROSS-REFERENCE TO RELATED APPLICATIONS

This application is based upon and claims the benefit of priority from the prior Japanese Patent Application Nos. 2004-252752 filed on Aug. 31, 2004, and 2005-098875 filed on Mar. 30, 2005, the entire contents of which are incorporated herein by reference.

BACKGROUND OF THE INVENTION

1. Field of the Invention

The present invention relates to a substrate structure using a so-called carbon nano tube (CNT) which is a linear structure made of a carbon element and a manufacturing method of the same.

2. Description of the Related Art

A carbon nano tube (CNT) which is a linear structure of a carbon-based self-organizing material attracts attention because of its many appealing physical properties.

As a method of growing CNTs while controlling a portion where the CNTs are formed, a chemical vapor deposition method (CVD method), more specifically, a thermal CVD method, a plasma CVD method, or a hot filament CVD method is desirable in terms of purity and mass productivity. Among methods of selectively growing CNTs on a substrate are, for example, techniques disclosed in Patent Documents 1 and 2. In Patent Document 1, a method of fabricating a catalytic metal film for CNTs in a desired pattern and selectively forming the CNTs on the catalytic metal film by the CVD method is adopted. In Patent Document 2, with consideration given to adhesion to a substrate and so on, a method of pattern-forming a non-catalytic metal film on the substrate, then pattern-forming a catalytic metal film on the non-catalytic metal film, and selectively forming CNTs on the catalytic metal film by the CVD method is adopted.

(Patent Document 1)
Japanese Patent Application Laid-open No. 2002-53085
(Patent Document 2)
Japanese Patent Application Laid-open No. 2002-115071
(Patent Document 3)
Japanese Patent Application Laid-open No. 2003-211396
(Patent Document 4)
Japanese Patent Application Laid-open No. 2003-50487
(Patent Document 5)
Japanese Patent Application Laid-open No. 2004-67413

However, in the aforementioned conventional arts, there is a problem that when the catalytic metal film is patterned, the other portions on the substrate are damaged. Further, there is a worry that by patterning the catalytic metal film, this catalytic metal film is naturally contaminated, which exerts a great influence on the growth of the CNTs. Furthermore, in the aforementioned conventional arts, the technical idea of controlling the length of the CNT is not disclosed, and hence it is extremely difficult to form a microstructure represented by various kinds of wirings using the CNTs.

SUMMARY OF THE INVENTION

The present invention is made in view of the aforementioned problems, and its object is to provide a substrate structure which makes it possible to easily and certainly grow CNTs with desired lengths in a predetermined region with any given shape/area on a substrate without patterning a catalyst material and therefore without damaging the other portions on the substrate and contaminating the catalyst material and can be extensively applied to various kinds of wirings, a heat release mechanism, and so on of an electronic device represented by a semiconductor device or the like, and a manufacturing method of the same.

A substrate structure of the present invention comprises: a substrate; a base film pattern-formed in a predetermined region on the substrate; a catalyst material deposited on the substrate so as to cover the base film; and a linear structure made of a carbon element and formed only on a portion corresponding to a portion on the base film of the catalyst material.

A manufacturing method of a substrate structure of the present invention comprises the steps of: pattern-forming a base film in a predetermined portion on a substrate; depositing a catalyst material on the substrate so as to cover the base film; and subjecting the catalyst material to growth processing of a linear structure made of a carbon element to form the linear structure only on a portion corresponding to a portion on the base film of the catalyst material.

A manufacturing method of a substrate structure of the present invention comprises the steps of: depositing a catalyst material on a base film above a substrate; and subjecting the catalyst material to growth processing of a linear structure made of a carbon element to form the linear structure only on a portion corresponding to a portion on the base film of the catalyst material, wherein the base film is formed while its thickness is adjusted, and a length of the linear structure is controlled in such a manner that the thinner the base film is formed, the longer the linear structure becomes.

BRIEF DESCRIPTION OF THE DRAWINGS

FIG. 5A and FIG. 5B are schematic perspective views showing a comparative example of the first embodiment;

FIG. 8A and FIG. 8B are schematic perspective views showing main steps of a manufacturing method of a substrate structure according to a modified example 3 of the first embodiment;

FIG. 11A and FIG. 11B are schematic perspective views showing main steps of a manufacturing method of a substrate structure according to a modified example 2 of the second embodiment;

DETAILED DESCRIPTION OF THE PREFERRED EMBODIMENTS

Basic Gist of the Present Invention

Figure 1:
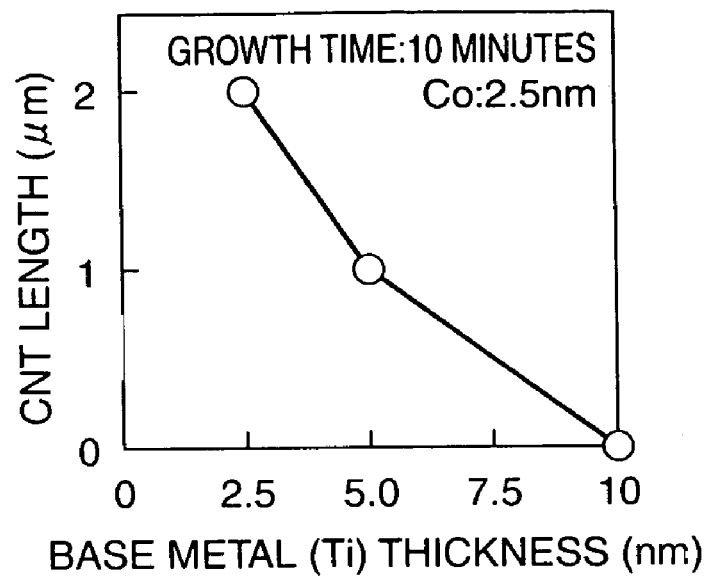
FIG. 1 is a characteristic chart showing the relation between the thickness of a base film and the length of a CNT.

The present inventor finds out that if, in growing CNTs using a catalyst material by a CVD method, some kind of base material exists under the catalyst material, the CNTs grow only on a portion corresponding to a portion on the base material of the catalyst material. Using this fact, a base film is pattern-formed to have a predetermined shape/area on a substrate, the catalyst material is deposited on the entire surface of the substrate so as to cover the base film, and growth processing by the CVD method is performed on a surface of the catalyst material. By this processing, the CNTs can be formed only on a portion of the catalyst material where the base film is formed without patterning the catalyst material.

To form the CNTs with desired length/density using the patterned base film, it is suitable to use the CVD method such as a thermal CVD method, a plasma CVD method, or a hot filament CVD method at a low growth temperature from 350° C. to 700° C. If the growth temperature is lower than 350° C., deterioration in the film quality of the CNTs becomes a problem, and if the growth temperature is higher than 700° C., the CNTs grow also in a portion where the base film does not exist, which is disadvantageous. Accordingly, by controlling the growth temperature at a predetermined value within the aforementioned temperature range, the CNTs with the desired length/density can be formed only on the portion corresponding to the portion on the base film.

Here, a combination of the base material and the catalyst material is important, and it is desirable that the base material be one kind selected from titanium (Ti), tantalum (Ta), molybdenum (Mo), vanadium (V), copper (Cu), an alloy composed of at least two kinds selected from these metals, metal oxides of these metals, and metal nitrides of these metals, and that the catalyst material be one kind selected from iron (Fe), nickel (Ni), cobalt (Co), and an alloy composed of at least two kinds selected from these metals. The base material may be the metal oxide or the metal nitride of each of the aforementioned metals, and hence the growth of the CNTs is not influenced by contamination and deterioration such as oxidation of the base film when the base film is patterned.

As an specific form of the catalyst material, it is thought that the catalyst material is formed in a film shape, or deposited in a particle shape. For example, in order to densely form the CNTs with predetermined shape/area flatly on the substrate, the catalyst material may be formed in the film shape, and in order to form the CNTs so as to be embedded in a trench or a pore formed in an interlayer insulating film on the substrate, it is necessary to make the catalyst material certainly reach a fine region, so that it is desirable to deposit the catalyst material in the particle shape.

In the present invention, when the catalyst material is deposited in the particle shape, catalyst particles are deposited on the entire surface so as to have uniform particle size and density. The thickness of the CNT depends on the particle size of the catalyst particle, and the larger the particle size, the thicker the CNT grows, whereby it becomes possible to form the respective CNTs formed from respective catalyst particles at even intervals and at a uniform thickness.

This technique is applied, for example, to a transistor structure. In this case, the base film is formed on a source electrode or a drain electrode, the CNTs are formed from respective catalyst particles deposited on the base film so as to have an uniform thickness at even intervals, and a channel region is formed by these CNTs. As described above; the respective catalyst particles are formed so as to have uniform particle size and density, and therefore, for example, by applying an electric field between the source electrode and the drain electrode (in a direction orthogonal to a longitudinal direction of a gate electrode) on the occasion of the growth processing of the CNTs, the respective CNTs are formed to have a uniform thickness at even intervals along a direction of the electric field so as to act as bridges between the source electrode and the drain electrode. Namely, due to the uniform particle size of the respective catalyst particles, the respective CNTs come to have a uniform thickness, and due to the uniform density of the catalyst particles and the application of the electric field in the aforementioned direction, the respective CNTs are formed at even intervals between the source electrode and the drain electrode. Then, the gate electrode is formed between the source electrode and the drain electrode on the CNTs with a gate insulating film in between. According to this configuration, the respective CNTs are formed to have a uniform thickness at even intervals, which makes it possible to control transistor characteristics as desired.

Further, the present inventor finds out that the length of the CNT which grows can be controlled by the thickness of the base film. Under the same processing condition, the thinner the base film is deposited, the longer the CNT grows. Using this fact makes it possible that base films with at least two different thicknesses are formed in plural portions on the substrate and subjected to CNT growth processing to simultaneously form the CNTs with lengths according to the thicknesses of the base films on the portions corresponding to the portions on the respective base films of the catalyst material.

Figure 2:
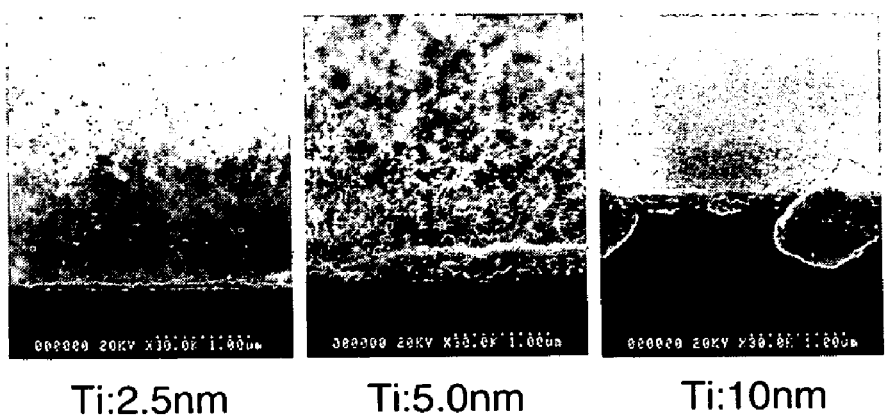
FIG. 2 shows scanning electron microscope photographs of CNTs when the thickness of a Ti film is approximately 2.5 nm, approximately 5.0 nm, and approximately 10 nm, respectively.

With a Ti film as the base film, the relation between the thickness of the base film and the length of the CNT is actually examined. Here, the catalyst material is a Co film with a thickness of approximately 2.5 nm, the growth temperature is 600° C., and the growth time is 10 minutes. The result of measurement is shown in FIG. 1. As shown, it is confirmed that when the thickness of the Ti film is approximately 2.5 nm, the length of the CNT is approximately 2 μm, when the thickness of the Ti film is approximately 5.0 nm, the length of the CNT is approximately 1 μm, and that when the thickness of the Ti film is approximately 10 nm, the CNT does not grow. The states of CNTs when the thickness of the Ti film is approximately 2.5 nm, 5.0 nm, and 10 nm, respectively, are shown by photographs taken by a scanning electron microscope (SEM) in FIG. 2. As shown, when the thickness of the Ti film is approximately 2.5 nm, the CNTs grow long (and at a high density), when the thickness thereof is approximately 5.0 nm, the CNTs grow shorter (and at a lower density) compared with the case of approximately 2.5 nm, and when the thickness thereof is approximately 10 nm, the CNTs hardly grow. Namely, it is known that the thinner the base film is deposited, the longer the CNT is formed, and that the length of the CNT which grows can be controlled by the thickness of the base film.

Specific Embodiments to Which the Present Invention is Applied

Embodiments of a substrate structure to which the present invention is applied and a manufacturing method thereof will be described below in detail with reference to the drawings. In the following embodiments, for convenience of explanation, mainly the configuration of the substrate structure will be described with the manufacturing method thereof.

First Embodiment

Figure 3A:
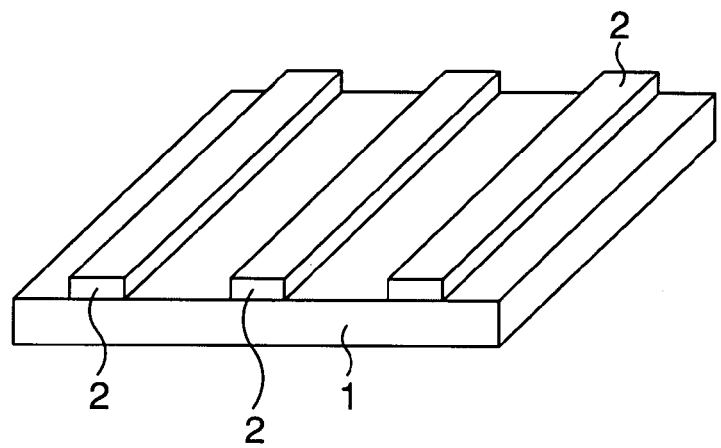
FIG. 3A to FIG. 3C are schematic perspective views showing main steps of a manufacturing method of a substrate structure according to a first embodiment.
Figure 3B:
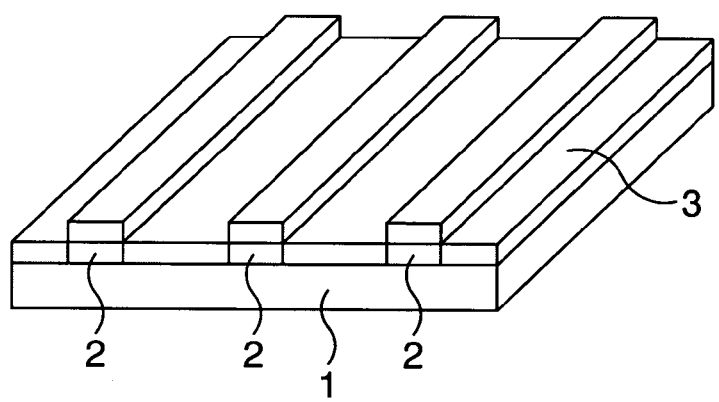
Figure 3C:
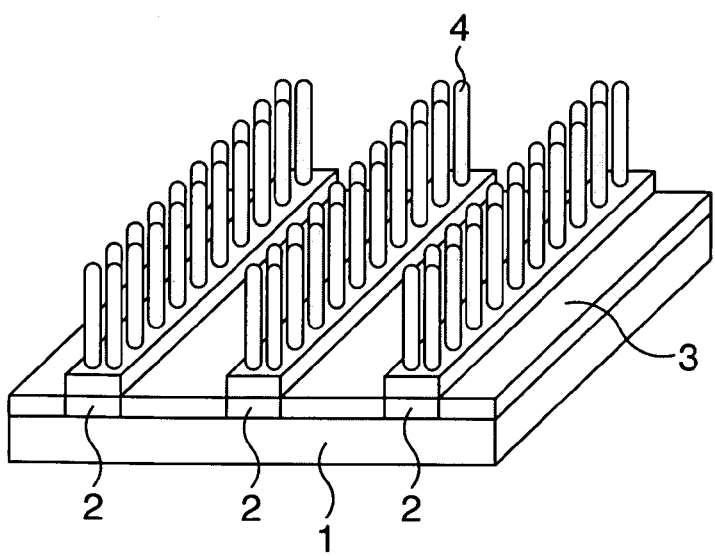

FIG. 3A to FIG. 3C are schematic perspective views showing main steps of a manufacturing method of a substrate structure according to the first embodiment.

In this embodiment, first, as shown in FIG. 3A, a Ti film 2 as a base film is deposited, for example, to have a thickness of approximately 1 nm on a silicon substrate 1, for example, by a sputtering method. This Ti film 2 is fabricated in a desired shape, in the example shown, in a band shape by photolithography and dry etching.

Subsequently, as shown in FIG. 3B, a catalyst material, here, a Co film 3 is formed to have a thickness of approximately 1 nm on the entire surface of the silicon substrate 1 so as to cover the band-shaped Ti film 2, for example, by the sputtering method.

Thereafter, the Co film 3 is subjected to CNT growth processing by the CVD method.

More specifically, by the thermal CVD method, the growth processing is executed with the growth temperature (environmental temperature in a CVD chamber) being set to a value within a range from 350° C. to 700° C., here approximately 600° C. in the application direction of the electric field perpendicular to the surface of the substrate. As a result, as shown in FIG. 3C, only in a portion under which the Ti film 2 is formed of the surface of the Co film 3, CNTs 4 are formed so as to rise from the surface of this portion. Namely, a substrate structure having a configuration in which after the model of the band shape of the Ti film 2, the CNTs 4 densely rise at a uniform density in all over the aforementioned portion is completed.

Figure 4A:
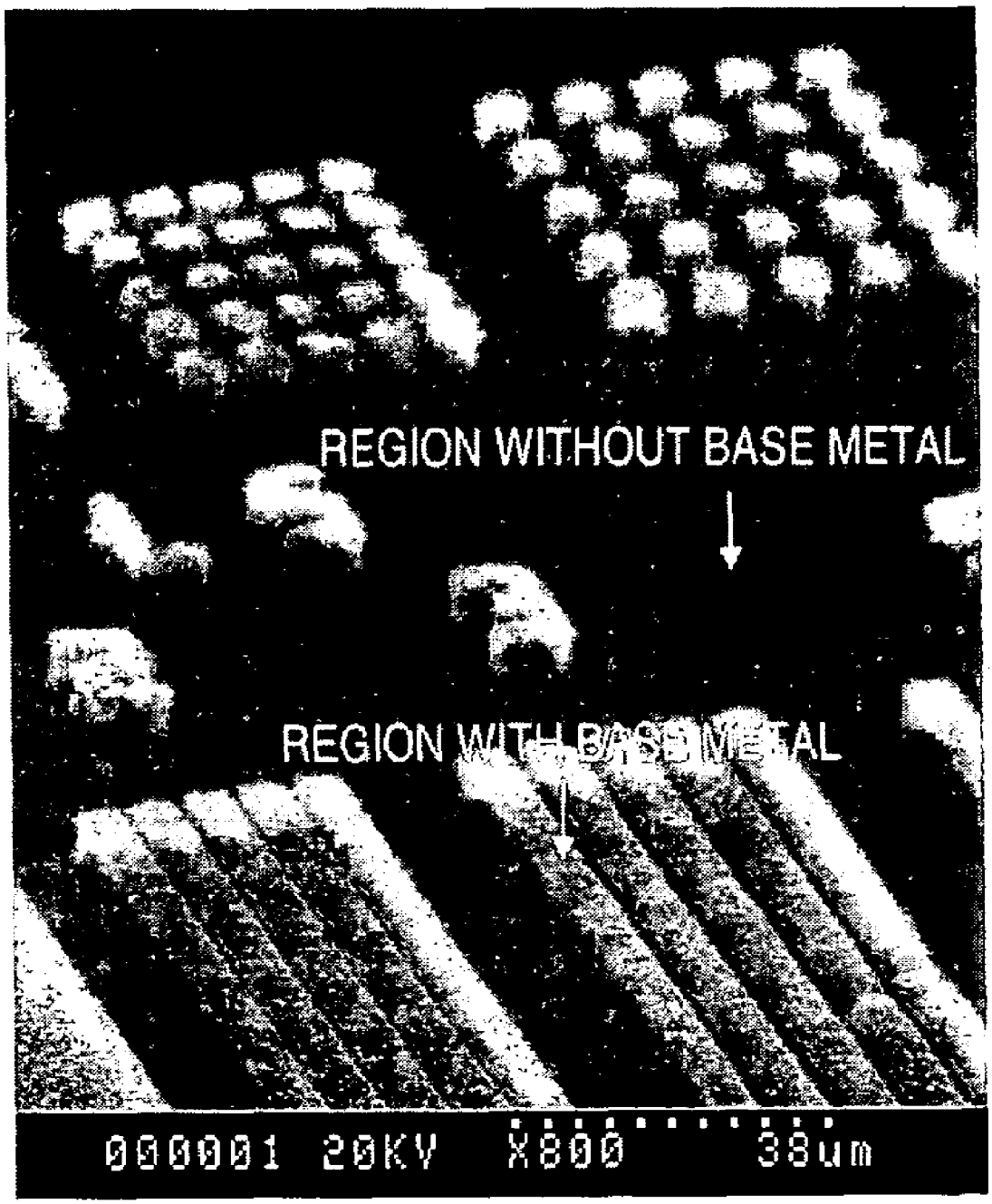
FIG. 4A shows a scanning electron microscope photograph of CNTs which have grown.
Figure 4B:
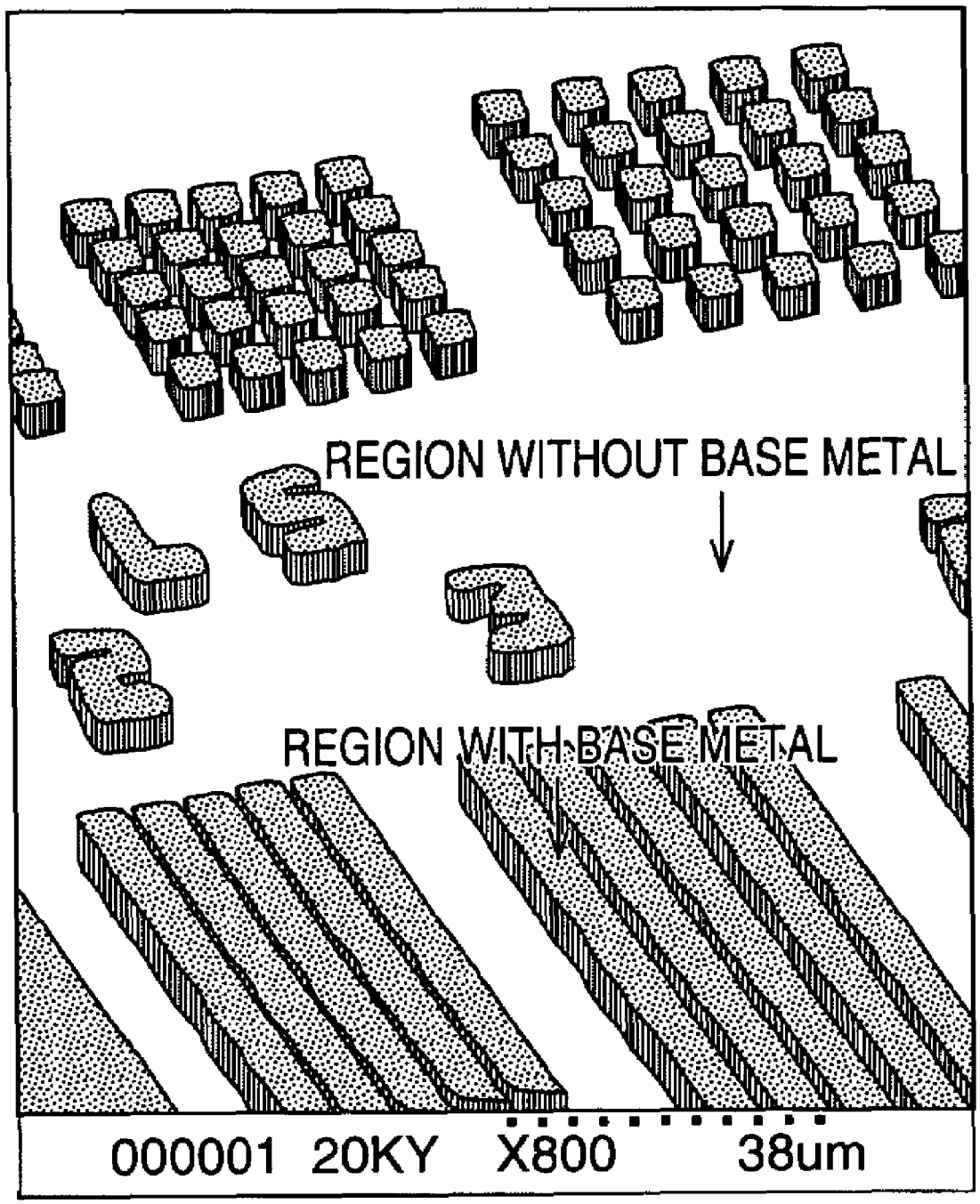
FIG. 4B is an auxiliary diagram illustrating the photograph in FIG. 4A by a picture.

A state in which the CNTs are actually grown is shown by a photograph taken by a scanning electron microscope (SEM) in FIG. 4A. FIG. 4B which illustrates FIG. 4A by a picture is added as an auxiliary figure of FIG. 4A.

Here, the Ti film as a base metal is patterned in a band shape, in a fine rectangular shape, and in a letter/number shape, the Co film is formed over the entire surface so as to cover the Ti film, and the CNTs are grown by the thermal CVD method. It can be clearly seen that the CNTs are not formed at all in a region without the base metal but formed dividedly and densely only in a region with the base metal.

Now, a comparative example of the first embodiment will be described.

FIG. 5 is a schematic perspective view showing the comparative example of the first embodiment. This comparative example is disclosed as a conventional example in which the contents of Patent Document 2 are taken into consideration.

Here, first, as shown in FIG. 5A, a Ti film 102 and a Co film 103 are stacked on a silicon substrate 101 by the sputtering method or the like, and these Co film 103 and Ti film 102 are patterned in a band shape by photolithography and dry etching. At this time, contamination of an etching residue and so on occurs on the Co film 103 due to the influence of the patterning or the like. If the CNT growth processing is performed by the thermal CVD method in this state, as shown in FIG. 5B, the CNTs do not grow in portions where the Co film 103 is contaminated, whereby the CNTs 104 are formed at a density lacking in uniformity on the Co film 103.

As described above, according to this embodiment, it becomes possible to easily and certainly grow the CNTs 4 in a predetermined region with any given shape/area on the silicon substrate 1 without patterning the Co film 3 which is the catalyst material and therefore without damaging the other portions on the silicon substrate 1 and contaminating the Co film 3, leasing to the realization of the substrate structure which can be extensively applied to various kinds of wirings, a heat release mechanism, and so on of an electronic device represented by a semiconductor device or the like.

Modified Example 1

The modified example 1 of the first embodiment will be described below. In this modified example 1, an example in which the technical idea of this embodiment is applied to a wiring of a semiconductor device is disclosed.

Figure 6A:
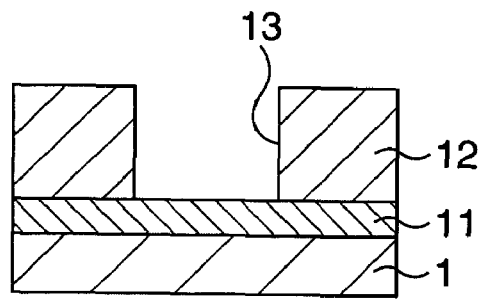
FIG. 6A to FIG. 6C are schematic sectional views showing main steps of a manufacturing method of a substrate structure according to a modified example 1 of the first embodiment.
Figure 6B:
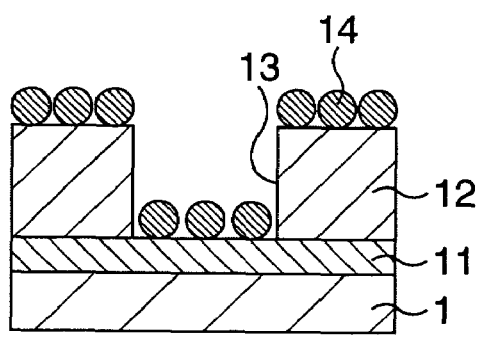
Figure 6C:
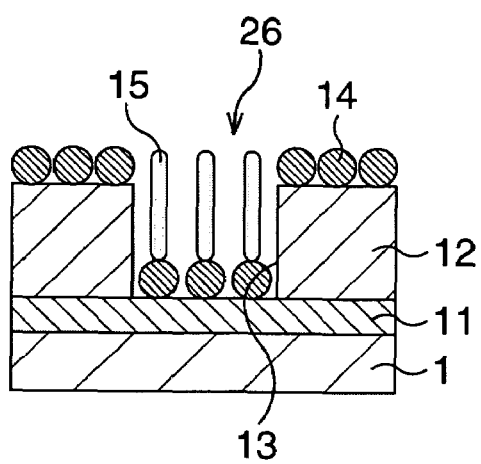

FIG. 6A to FIG. 6C are schematic sectional views showing main steps of a manufacturing method of a substrate structure according to the modified example 1 of the first embodiment.

First, as shown in FIG. 6A, a Ti film 11 as a base film is deposited, for example, to have a thickness of approximately 2.5 nm on the silicon substrate 1, for example, by the sputtering method. This Ti film 11 is patterned in a predetermined shape (not shown) by photolithography and dry etching.

Subsequently, a silicon oxide film or the like is deposited so as to cover the Ti film 11 having the predetermined shape, for example, by the CVD method to form an interlayer insulating film 12. Then, the interlayer insulating film 12 is patterned to form a wiring trench 13 by photolithography and dry etching. On this occasion, the Ti film 11 is exposed from a bottom surface of the wiring trench 13.

Thereafter, as shown in FIG. 6B, a catalyst material, here, Co particles 14 are deposited on the entire surface of the interlayer insulating film 12 including the bottom surface of the wiring trench 13 of the silicon substrate placed in a particle generating chamber, for example, by a laser ablation method. By using the Co particles 14 as the catalyst material, the Co particles 14 can certainly reach the bottom surface of the wiring trench 13 which is a fine region.

Then, the Co particles 14 are subjected to CNT growth processing by the CVD method.

More specifically, by the thermal CVD method, the growth processing is executed with the growth temperature (environmental temperature in the CVD chamber) being set to a value within a range from 350° C. to 700° C., here approximately 600° C. in the application direction of the electric field perpendicular to the surface of the substrate. As a result, as shown in FIG. 6C, only on a portion under which the Ti film 11 is formed of the Co particles 114, CNTs 15 are formed. Namely, in portions other than the wiring trench 13 of the interlayer insulating film 12, Ti does not exist under the Co particles, so that the CNTs do not grow, and only on the bottom surface of wiring trench 13 in which the Ti film 11 exists under the Co particles 14, the CNTs 15 are formed so as to rise from the bottom surface. As a result of this growth processing, the substrate structure in which a wiring 16 composed of the CNTs 15 which densely rise from the bottom surface of the wiring trench at a uniform density so as to fill the wiring trench 13 is formed is completed.

Here, the Ti film 11 is formed while its thickness is adjusted in such a manner that the CNTs 15 appropriately fill the wiring trench 13 when the CNTs 15 are grown.

Incidentally, the Ti film 11 may be patterned in a shape which fits the wiring trench 13. Moreover, FIG. 6A to FIG. 6C show a case where the Ti film 11 is formed directly on the silicon substrate 1 as an example, but, for example, it is also possible that a Ti film and Co particles are deposited on an interlayer insulating film formed on the silicon substrate 1 to form an upper wiring. Further, in this modified example 1, the case where the wiring 16 is formed by filling the wiring trench 13 of the interlayer insulating film 12 with the CNTs 15 as an example, but it is also possible that a connection hole is formed in an interlayer insulating film, and that CNTs are formed so as to fill this connection hole.

As described above, according to the modified example 1, it becomes possible to more easily and certainly grow the CNTs 15 which fill the fine wiring trench without damaging the silicon substrate 1 and contaminating the catalyst material and by depositing the catalyst particles as the catalyst material, leading to the realization of the substrate structure which can be applied to various kinds of wirings of an electronic device represented by a semiconductor device or the like.

Modified Example 2

The modified example 2 of the first embodiment will be described below. In this modified example 2, as in the modified example 1, an example in which the technical idea of this embodiment is applied to a wiring of a semiconductor device is disclosed.

Figure 7A:
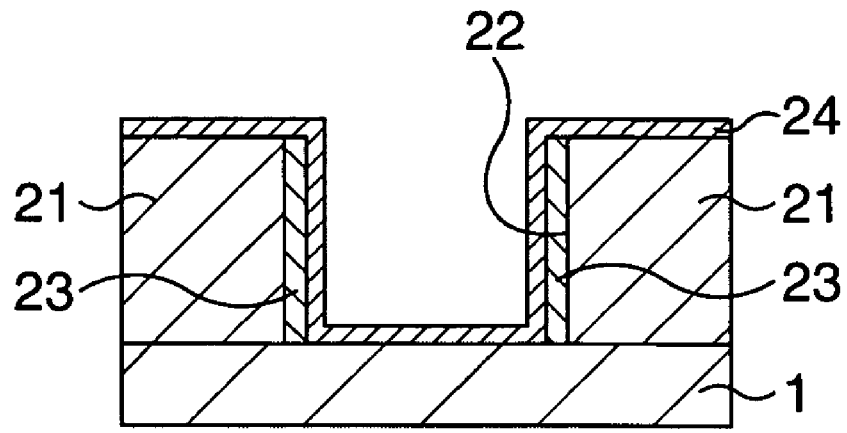
FIG. 7A and FIG. 7B are schematic sectional views showing main steps of a manufacturing method of a substrate structure according to a modified example 2 of the first embodiment.
Figure 7B:
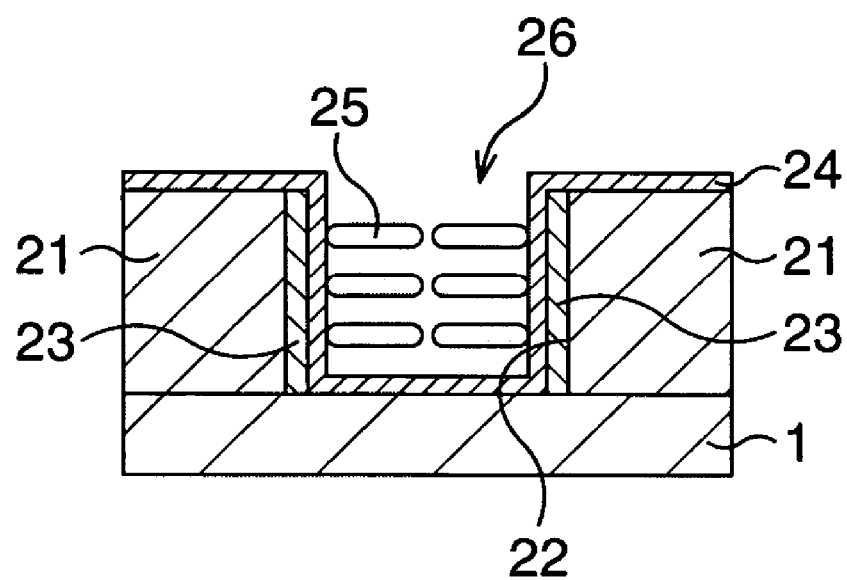

FIG. 7A and FIG. 7B are schematic sectional views showing main steps of a manufacturing method of a substrate structure according to the modified example 2 of the first embodiment.

First, as shown in FIG. 7A, a silicon oxide film or the like is deposited on the silicon substrate 1, for example, by the CVD method to form an interlayer insulating film 21. The interlayer insulating film 21 is patterned by photolithography and dry etching to form a wiring trench 22.

Subsequently, a Ti film1 23 as a base film is deposited, for example, to have a thickness of approximately 2.5 nm only on a sidewall surface of the wiring trench 22. A catalyst material, here a Co film 24 is deposited to have a thickness of approximately 2.5 nm on the interlayer insulating film 21 including an inner wall surface of the wiring trench 22 so as to cover the Ti film 23, for example, by the sputtering method.

Then, the Co film 24 is subjected to CNT growth processing by the CVD method.

More specifically, by the thermal CVD method, the growth processing is executed with the growth temperature (environmental temperature in the CVD chamber) being set to a value within a range from 350° C. to 700° C., here approximately 600° C. in the application direction of the electric field horizontal to the surface of the substrate. As a result, as shown in FIG. 7B, only on the sidewall surface of the wiring trench 22 under which the Ti film 23 is formed, CNTs 25 are formed parallel to the surface of the silicon substrate 1 so as to rise from the sidewall surface. As a result of this growth processing, the substrate structure in which a wiring 26 composed of the CNTs 15 which densely rise from the sidewall surface of the wiring trench 22 at a uniform density so as to fill the wiring trench 13 is formed is completed.

Incidentally, in the modified example 2, the case where the wiring 26 is formed by filling the wiring trench 22 of the interlayer insulating film 21 with the CNTs 25 as an example, but it is also possible that a connection hole is formed in an interlayer insulating film, and that CNTs are formed so as to fill this connection hole.

As described above, according to the modified example 2, it becomes possible to more easily and certainly grow the CNTs 25 which fill the fine wiring trench without damaging the silicon substrate 1 and contaminating the catalyst material and by depositing the catalyst particles as the catalyst material, leading to the realization of the substrate structure which can be applied to various kinds of wirings of an electronic device represented by a semiconductor device or the like.

Modified Example 3

The modified example 3 of the first embodiment will be described below. In this modified example 3, an example in which the technical idea of this embodiment is applied to a case where CNTs are formed so as to act as bridges between adjacent regions on a substrate is disclosed.

FIG. 8A and FIG. 8B are schematic perspective views showing main steps of a manufacturing method of a substrate structure according to the modified example 3 of the first embodiment.

In the beginning, as shown in FIG. 8A, band-shaped Ti films 31 are formed, and a Co film 32 is formed over the entire surface.

First, the Ti film 31 as a base film is deposited, for example, to have a thickness of approximately 1 nm on the silicon substrate 1, for example, by the sputtering method. Then, this Ti film 31 is fabricated in a desired shape, in the example shown, in the shape of a pair of adjacent bands parallel to each other by photolithography and dry etching.

Subsequently, a catalyst film, here the Co film 32 is formed to have a thickness of approximately 1 nm on the entire surface of the silicon substrate 1 so as to cover the band-shaped Ti films 31, for example, by the sputtering method.

Then, the Co film 32 is subjected to CNT growth processing by the CVD method.

More specifically, by the thermal CVD method, the growth processing is executed with the growth temperature (environmental temperature in the CVD chamber) being set to a value within a range from 350° C. to 700° C., here approximately 600° C. while the electric field is applied horizontally to the surface of the substrate and in a direction orthogonal to a longitudinal direction of the Ti films 31. The technique of forming CNTs by applying the electric field horizontally to the surface of the substrate and in the direction orthogonal to the longitudinal direction of the Ti films 31 is disclosed, for example, in Patent Documents 3 and 4. As a result, as shown in FIG. 8B, the substrate structure having a configuration in which CNTs 33 are formed along the application direction of the electric field and parallel to the surface of the silicon substrate 1 so as to act as bridges between portions under which the adjacent Ti films 31 are formed out of the surface of the Co film 32 is completed.

As described above, according to the modified example 3, it becomes possible to easily and certainly grow the CNTs 33 in a predetermined region with any given shape/area on the silicon substrate 1 without patterning the Co film 32 which is the catalyst material and therefore without damaging the other portions on the silicon substrate 1 and contaminating the Co film 32, leading to the realization of the substrate structure which can be extensively applied to an electronic device and so on represented by a semiconductor device and the like.

Second Embodiment

In this embodiment, specific examples in which a portion where CNTs are formed is controlled using a base film as in the first embodiment are disclosed, but this embodiment is different in that the portion where the CNTs are formed and the lengths of the CNTs are controlled by adjusting the thickness of the base film.

Figure 9A:
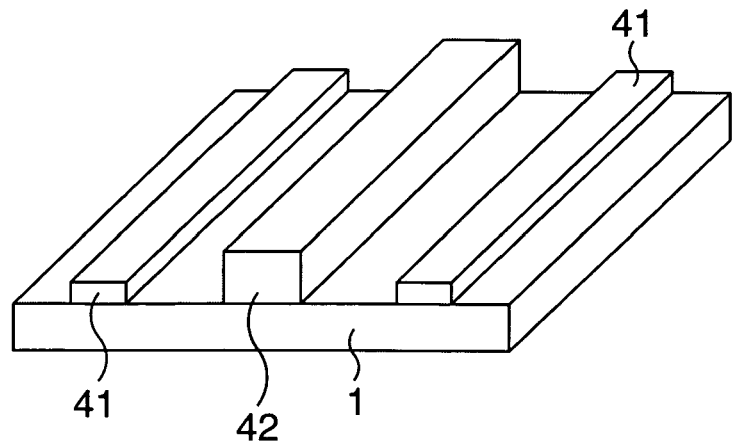
FIG. 9A to FIG. 9C are schematic perspective views showing main steps of a manufacturing method of a substrate structure according to a second embodiment.
Figure 9B:
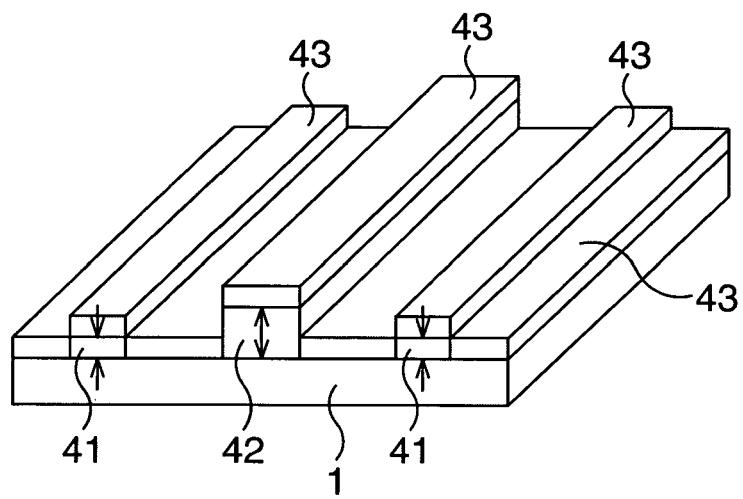
Figure 9C:
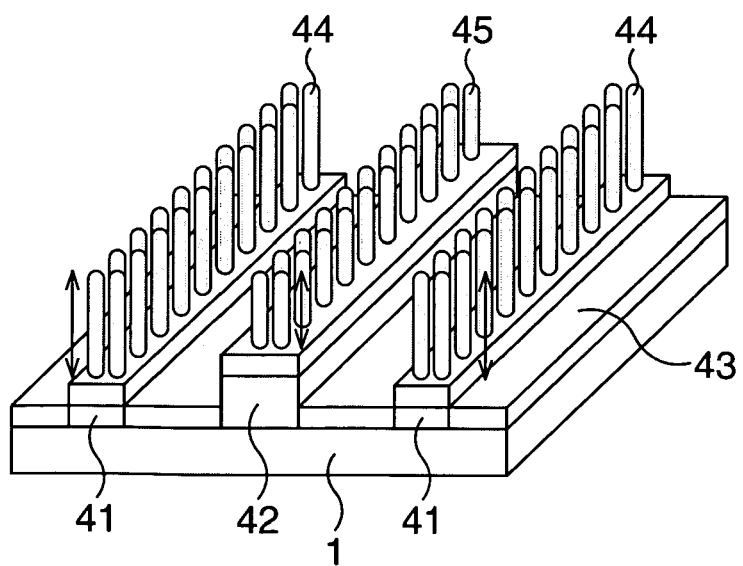

FIG. 9A to FIG. 9C are schematic perspective views showing main steps of a manufacturing method of a substrate structure according to the second embodiment.

In this embodiment, first, as shown in FIG. 9A, a Ti film 41 as a base film is deposited, for example, to have a thickness of approximately 1 nm on the silicon substrate 1, for example, by the sputtering method. Then, this Ti film 41 is fabricated in a desired shape, in the example shown, in a band shape by photolithography and dry etching.

Subsequently, a photoresist (not shown) is applied thicker than the Ti film 41 onto the entire surface of the silicon substrate 1, and a desired shaped, here, band-shaped trench (not shown) is formed between the adjacent Ti films 41 in the photoresist by photolithography. After a Ti film 42 is deposited on the photoresist so as to be embedded in this trench, for example, by the sputtering method, the photoresist and the Ti film 42 thereon are removed. At this time, the band-shaped Ti film 42 having a thickness of approximately 10 nm which is thicker than the Ti film 41 is left.

Thereafter, as shown in FIG. 9B, a catalyst material, here a Co film 43 is formed to have a thickness of approximately 1 nm on the entire surface of the silicon substrate 1 so as to cover the band-shaped Ti films 41 and 42, for example, by the sputtering method.

Then, the Co film 43 is subjected to CNT growth processing by the CVD method.

More specifically, by the thermal CVD method, the growth processing is executed with the growth temperature (environmental temperature in the CVD chamber) being set to a value within a range from 350° C. to 700° C., here approximately 600° C. in the application direction of the electric field perpendicular to the surface of the substrate. As a result, as shown in FIG. 9C, only on portions under which the Ti films 41 and 42 are formed out of the surface of the Co film 43, CNTs are formed so as to rise from surfaces of these portions. On this occasion, the thinner the Ti film as the base film is deposited, the longer the CNT is formed, and therefore, out of the surface of the Co film 43, CNTs 44 are formed on the portion under which the Ti film 41 is formed, and simultaneously CNTs 45 shorter than the CNTs 44 are formed on the portion under which the Ti film 42 is formed. As a result of this growth processing, the substrate structure having a configuration in which after the model of the band shapes of the Ti films 41 and 42, the CNTs 44 and the CNTs 45 shorter than the CNTs 44 densely rise respectively at a uniform length and at a uniform density in all over the aforementioned respective portions is completed.

As described above, according to this embodiment, it becomes possible to easily and certainly grow the CNTs 44 and 45 each in a predetermined region with any given shape/area on the silicon substrate 1 without patterning the Co film 43 which is the catalyst material and therefore without damaging the other portions on the silicon substrate 1 and contaminating the Co film 43, leading to the realization of the substrate structure which can be extensively applied to various kinds of wirings, a heat release mechanism, and so on of an electronic device represented by a semiconductor device or the like.

Further, according to this embodiment, by forming the Ti films 41 and 42 as the base films while adjusting their thicknesses, the lengths of the CNTs which grow can be easily controlled. More specifically, the CNTs 44 and 45 can be formed in such a manner that the latter is shorter than the former, and hence CNTs having different lengths can be formed at the same time in respective predetermined regions with any given shapes/areas on the silicon substrate 1 in a single growth processing process, which makes it possible to form, in various microfabrication portions such as various kinds of wiring trenches and connection holes having different sizes, CNTs which match these sizes in the fewest possible steps.

Modified Example 1

The modified example 1 of the second embodiment will be described below. In this modified example 1, an example in which the technical idea of this embodiment is applied to a wiring of a semiconductor device is disclosed.

FIG. 10A to FIG. 10D are schematic sectional views showing main steps of a manufacturing method of a substrate structure according to the modified example 1 of the second embodiment.

Figure 10A:
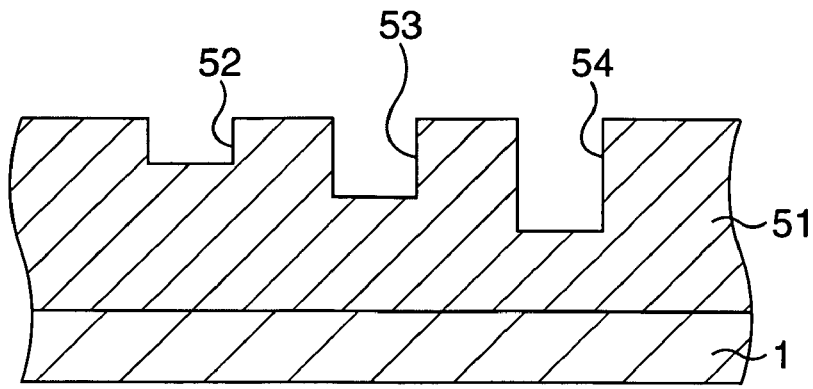
FIG. 10A to FIG. 10D are schematic sectional views showing main steps of a manufacturing method of a substrate structure according to a modified example 1 of the second embodiment.

First, as shown in FIG. 10A, a silicon oxide film or the like is deposited on the silicon substrate 1 to form an interlayer insulating film 51, for example, by the CVD method. The interlayer insulating film 51 is patterned by photolithography and dry etching to form wiring trenches 52, 53, and 54 having different depths (in order from shallowest to deepest). Here, via holes or the like are formed in bottom portions of the respective wiring trenches 52, 53, and 54 and connected to a lower wiring or the like, but the via holes or the like and the lower wiring or the like are not shown here.

Figure 10B:
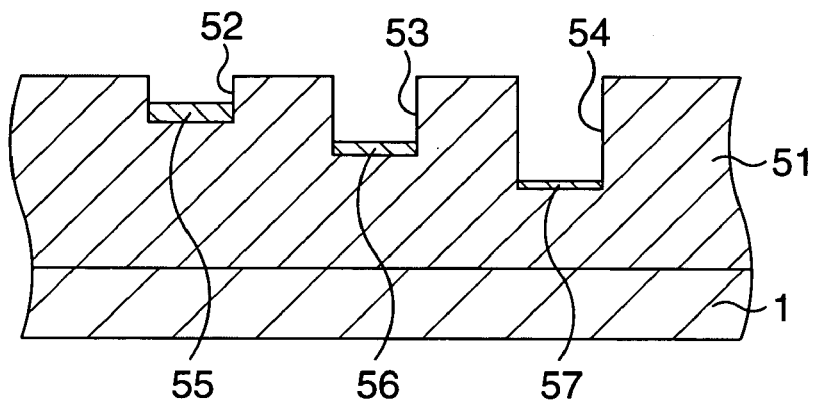

Subsequently, as shown in FIG. 10B, Ti films 55, 56, and 57 each as a base film are formed on the bottom portions of the wiring trenches 52, 53, and 54. Here, the Ti films 55, 56, and 57 are formed to have thicknesses of 30 nm, 10 nm, and 1 nm in order from thickest to thinnest. These thicknesses are controlled at values fitted to fill the wiring trenches 52, 53, and 54 with CNTs, respectively.

Figure 10C:
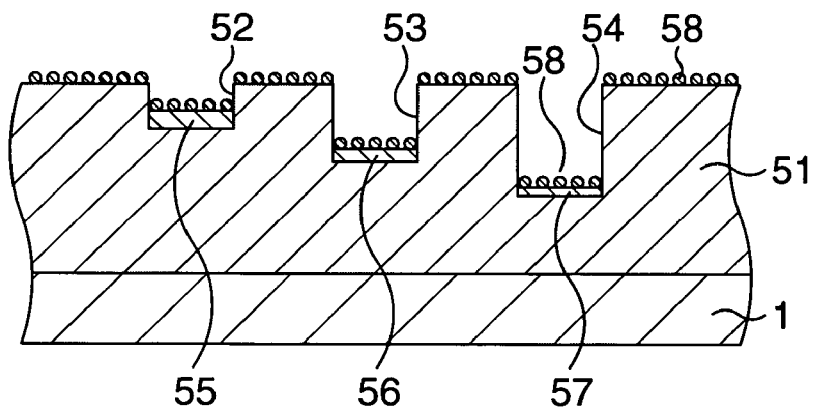

Thereafter, as shown in FIG. 10C, a catalyst material, here Co particles 58 are deposited on the entire surface of the interlayer insulating film 51 including bottom surfaces of the wiring trenches 52, 53, and 54 of the silicon substrate 1 placed in the particle generating chamber, for example, by the laser ablation method. By using the Co particles 58 as the catalyst material, the Co particles 58 can certainly reach the bottom surfaces of the wiring trenches 52, 53, and 54 which are fine regions.

Then, the Co particles 58 are subjected to CNT growth processing by the CVD method.

Figure 10D:
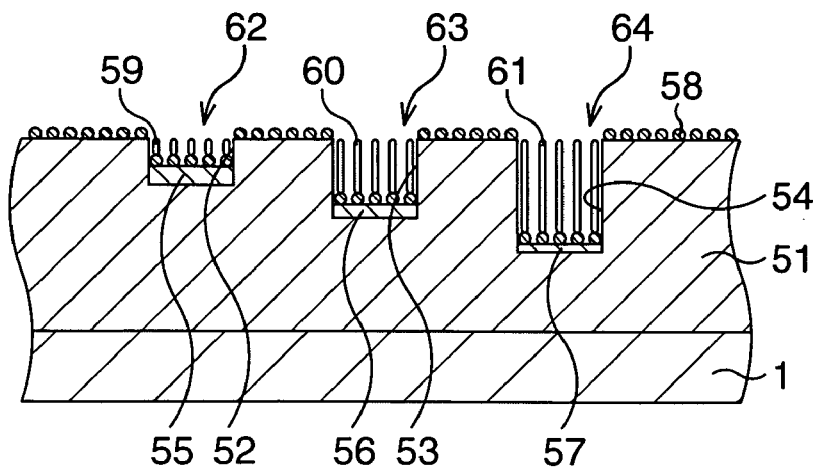

More specifically, by the thermal CVD method, the growth processing is executed with the growth temperature (environmental temperature in the CVD chamber) being set to a value within a range from 350° C. to 700° C., here approximately 600° C. in the application direction of the electric field perpendicular to the surface of the substrate. As a result, as shown in FIG. 10D, only on portions under which the Ti films 55, 56, and 57 are formed of the Co particles 58, CNTs 59, 60, and 61 are formed. Namely, on portions other than bottom surfaces of the wiring trenches 52, 53, and 54, Ti does not exist under the Co particles 58, so that the CNTs do not grow, and only on the bottom surfaces of the wiring trenches 52, 53, and 54 at which the Ti films 55, 56, and 57 exist under the Co particles 58, the CNTs 59, 60, and 61 are formed so as to rise from the bottom surfaces.

On this occasion, the thinner the Ti film as the base film is deposited, the longer the CNT is formed, and therefore, out of the Co particles 58, the CNTs 59 which fill the wiring trench 52 are formed on the portion under which the Ti film 55 is formed, the CNTs 60 which are longer than the CNTs 59 and fill the wiring trench 53 are formed on the portion under which the Ti film 56 is formed, and the CNTs 61 which are longer than the CNTs 60 and fill the wiring trench 54 are formed on the portion under which the Ti film 57 is formed at the same time. As a result of this growth processing, the substrate structure in which wirings 62, 63, and 64 composed of the CNTs 59, 60, and 61 which, respectively, densely rise at a uniform density so as to fill the wiring trenches 52, 53, and 54 from the bottom surfaces of the wiring trenches 52, 53, and 54 are formed is completed.

Incidentally, in this modified example 1, the case where the wirings 62, 63, and 64 are formed by filling the wiring trenches 52, 53, and 54 of the interlayer insulating film 51 with the CNTs 59, 60, and 61, respectively, as an example, but it is also possible that a connection hole is formed in an interlayer insulating film, and that CNTs are formed so as to fill this connection hole.

As described above, according to the modified example 1, it becomes possible to more easily and certainly grow the CNTs 59, 60, and 61 which fill the fine wiring trenches without damaging the silicon substrate 1 and contaminating the catalyst material and by depositing the catalyst particles as the catalyst material, leading to the realization of the substrate structure which can be applied to various kinds of wirings of an electronic device represented by a semiconductor device or the like.

Moreover, according to the modified example 1, by forming the Ti films 55, 56, and 57 as the base films while adjusting their thicknesses, the lengths of the CNTs 59, 60, and 61 which grow can be easily controlled, more specifically, the CNTs 59, 60, and 61 can be formed in order from shortest to longest, and hence in a single growth processing process, in the wiring trenches and connection holes having different sizes, CNTs having different lengths which match the respective sizes can be formed at the same time, which makes it possible to form the CNTs which match these sizes in the fewest possible steps.

Modified Example 2

The modified example 2 of the second embodiment will be described below. In this modified example 2, an example in which the technical idea of this embodiment is applied to a case where CNTs are formed so as to act as bridges between adjacent regions on a substrate is disclosed.

FIG. 11A and FIG. 11B are schematic perspective views showing main steps of a manufacturing method of a substrate structure according to the modified example 2 of the second embodiment.

First, as shown in FIG. 11A, a Ti film 71 as a base film is deposited, for example, to have a thickness of approximately 1 nm on the silicon substrate 1, for example, by the sputtering method. Then, this Ti film 71 is fabricated in a desired shape, in the example shown, in the shape of a pair of adjacent bands parallel to each other by photolithography and dry etching.

Subsequently, a photoresist (not shown) is applied thicker than the Ti film 71 onto the entire surface of the silicon substrate 1, and a desired shaped, here, band-shaped trench (not shown) is formed between the adjacent Ti films 71 in the photoresist by photolithography. After a Ti film 72 is deposited on the photoresist so as to be embedded in this trench, for example, by the sputtering method, the photoresist and the Ti film 72 thereon are removed. At this time, between the Ti films 71, a pair of the band-shaped Ti films 72 having a thickness of approximately 5 nm which are thicker than the Ti film 71 and parallel and adjacent to each other with a distance therebetween shorter than that between a pair of the Ti films 71 is left.

Here, the respective thicknesses of the pair of Ti films 71 and the pair of Ti films 72 are controlled at values fitted to form the CNTs which act as bridges, respectively.

Thereafter, a catalyst material, here the Co film 73 is formed to have a thickness of approximately 1 nm on the entire surface of the silicon substrate 1 so as to cover the band-shaped Ti films 71 and 72, for example, by the sputtering method.

Then, the Co film 73 is subjected to CNT growth processing by the CVD method.

More specifically, by the thermal CVD method, the growth processing is executed with the growth temperature (environmental temperature in the CVD chamber) being set to a value within a range from 350° C. to 700° C., here approximately 600° C. while the electric field is applied horizontally to the surface of the substrate and in a direction orthogonal to a longitudinal direction of the Ti films 71 and 72. As a result, as shown in FIG. 11B, CNTs 74 and 75 are formed parallel to the surface of the silicon substrate 1 so as to act as bridges between portions under which the Ti films 71 and 72 are formed out of the surface of the Co film 73. On this occasion, the thinner the Ti film as the base film is deposited, the longer the CNT is formed, and therefore, out of the surface of the Co film 73, between the portions under which the Ti films 71 are formed, the CNTs 74 having a length to act as bridges between these portions are formed, and between the portions under which the Ti films 72 are formed, the CNTs 75 having a length shorter than the CNTs 74 to act as bridges between these portions are formed at the same time. As a result of this growth processing, the substrate structure in which the CNTs 74 and 75 whose distances are adjusted to match the distances between the adjacent Ti films is completed.

As described above, according to the modified example 2, it becomes possible to easily and certainly grow the CNTs 74 and 75 in predetermined regions with any given shapes/areas on the silicon substrate 1 without patterning the Co film 73 which is the catalyst material and therefore without damaging the other portions on the silicon substrate 1 and contaminating the Co film 73, leading to the realization of the substrate structure which can be extensively applied to an electronic device and so on represented by a semiconductor device and so on.

Further, according to the modified example 2, by forming the Ti films 71 and 72 as the base films while adjusting their thicknesses, the lengths of the CNTs which grow can be easily controlled, more specifically, the CNTs 74 and 75 can be formed in such a manner that the latter is shorter than the former, and hence the CNTs having different lengths can be formed at the same time in respective predetermined regions with any given shapes/areas on the silicon substrate 1 in a single growth processing process, which makes it possible to form, in various microfabrication portions such as various kinds of wiring trenches and connection holes having different sizes, CNTs which match these sizes in the fewest possible steps.

Modified Example 3

The modified example 3 of the second embodiment will be described below. In this modified example 3, an example in which the technical idea of this embodiment is applied to a heat release mechanism of a semiconductor device is disclosed.

Figure 12:
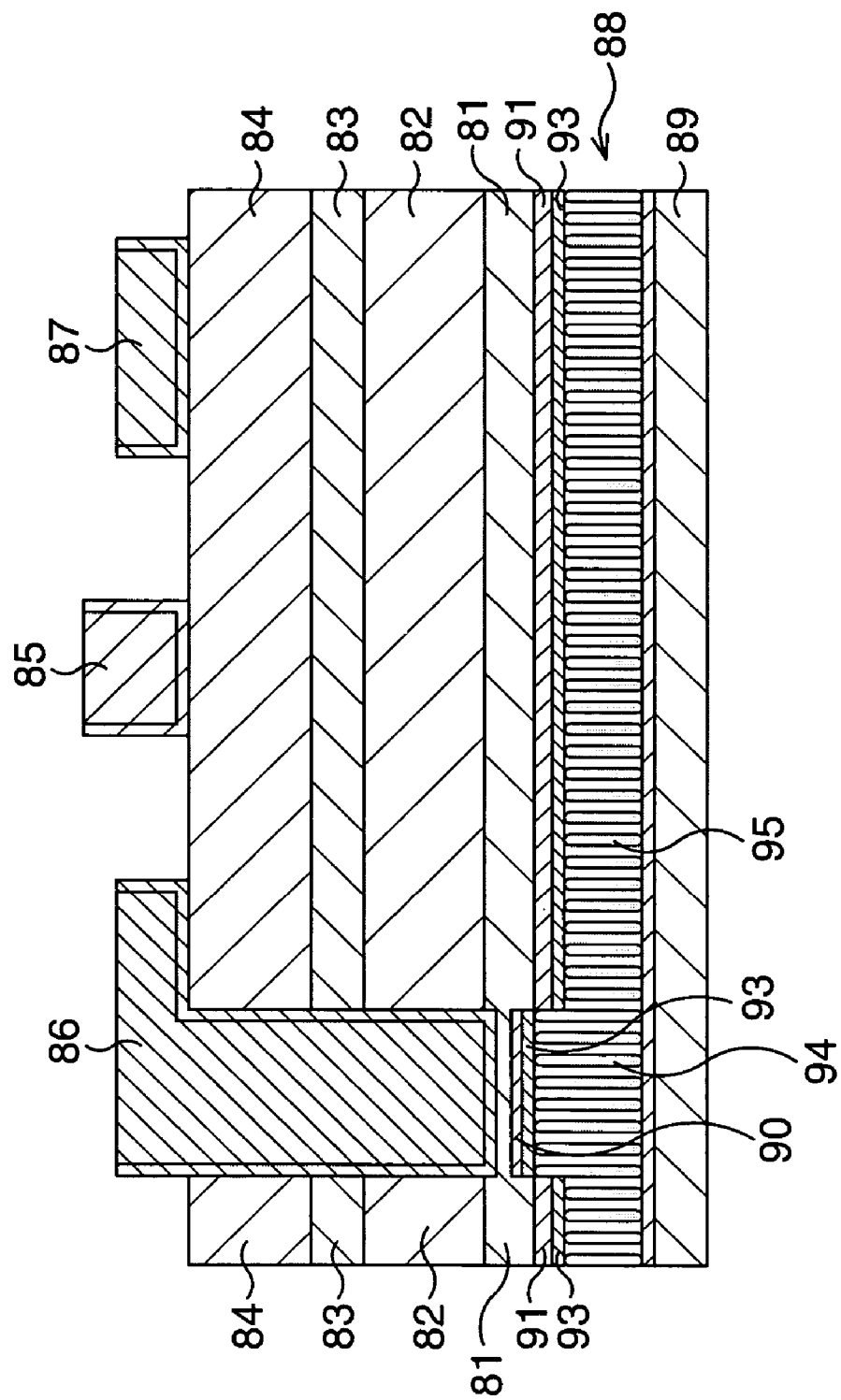
FIG. 12 is a schematic sectional view showing a main step of a manufacturing method of a substrate structure according to a modified example 3 of the second embodiment.

FIG. 12 is a schematic sectional view showing a main configuration of a substrate structure according to the modified example 3 of the second embodiment.

This substrate structure is a so-called HEMT-type semiconductor device, in which a channel layer 82, a spacer layer 83, and an electron supply layer 84 are stacked in sequence on a substrate 81 such as SiC, and a gate electrode 85, for example, made of Pt and Au, and a source electrode 86 and a drain electrode 87 respectively on both sides of the gate electrode 85 are pattern-formed on the electron supply layer 84.

The source electrode 86 penetrates the electron supply layer 84, the spacer layer 83, and the channel layer 82, and it is formed in such a manner that an opening which reaches a bottom surface of a hole 81a formed in a rear surface of the substrate 81 is filled with an electrode material, and electrically connected to a ground electrode 89 in an undermost portion via a conductive heat release mechanism 88 provided on the rear surface of the substrate 81.

The heat release mechanism 88 releases heat generated in the source electrode 86 downward, and includes: a base film formed on the rear surface of the substrate 81, here Ti films 90 and 91; a catalyst material formed on the entire rear surface so as to cover the Ti films 90 and 91, here a Co film 93 with a thickness of approximately 1 nm; and CNTs 94 and 95 which are densely oriented in a vertical direction from the surface of the Co film 93.

The Ti film 90 is pattern-formed to have a thickness of approximately 1 nm on the bottom surface of the hole 81a of the substrate 81, and the Ti film 91 is pattern-formed on the rear surface of the substrate 81 except the hole 81a with its thickness being controlled to be thicker than the Ti film 90, here with a thickness of approximately 2.5 nm. On a portion under which the Ti film 90 exists of the Co film 93, the CNTs 94 are formed, and on a portion under which the Ti film 91 exists of the Co film 93, the CNTs 95 shorter than the CNTs 94 are formed, respectively, so that the positions of the CNTS 94 and 95 are adjusted to be aligned on a bottom surface of the heat release mechanism 88.

As described above, according to the modified example 3, it becomes possible to grow the CNTs 94 and 95 without patterning the Co film 93 as the catalyst material and therefore without damaging the other portions on the silicon substrate 1 and contaminating the Co film 93, and hence the substrate structure which includes the heat release mechanism is easily and certainly realized without increasing the number of steps.

Moreover, according to the modified example 3, by forming the Ti films 90 and 91 as the base films while adjusting their thicknesses, the lengths of the CNTs which grow can be easily controlled, more specifically, the CNTs 94 and 95 can be formed in such a manner that the former is longer than the latter, and hence the CNTs 94 and 95 having different lengths can be formed at the same time in predetermined regions of the rear surface of the substrate 81 in a single growth processing process, which makes it possible to form, in various microfabrication portions having different sizes, CNTs which match these sizes in the fewest possible steps.

Third Embodiment

Figure 13A:
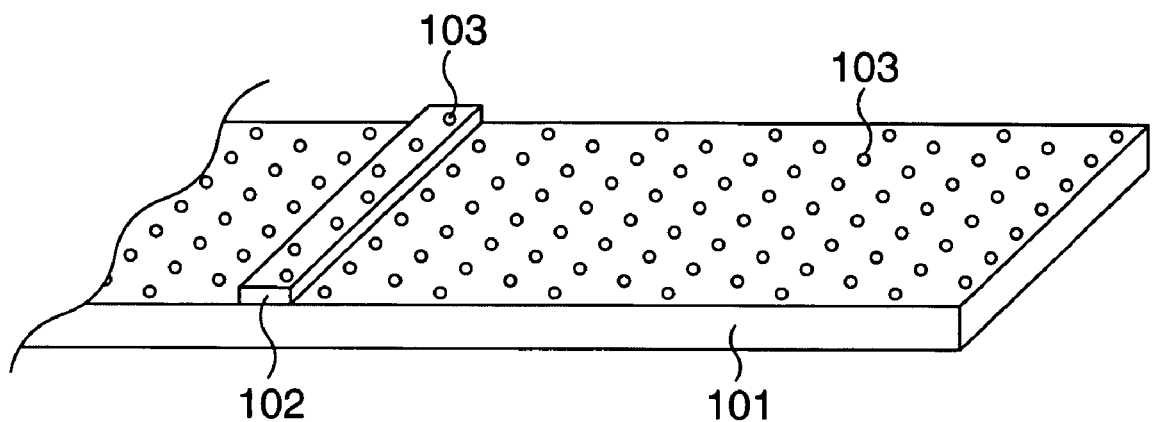
FIG. 13A and FIG. 13B are schematic perspective views showing main steps of a manufacturing method of a substrate structure according to a third embodiment.
Figure 13B:
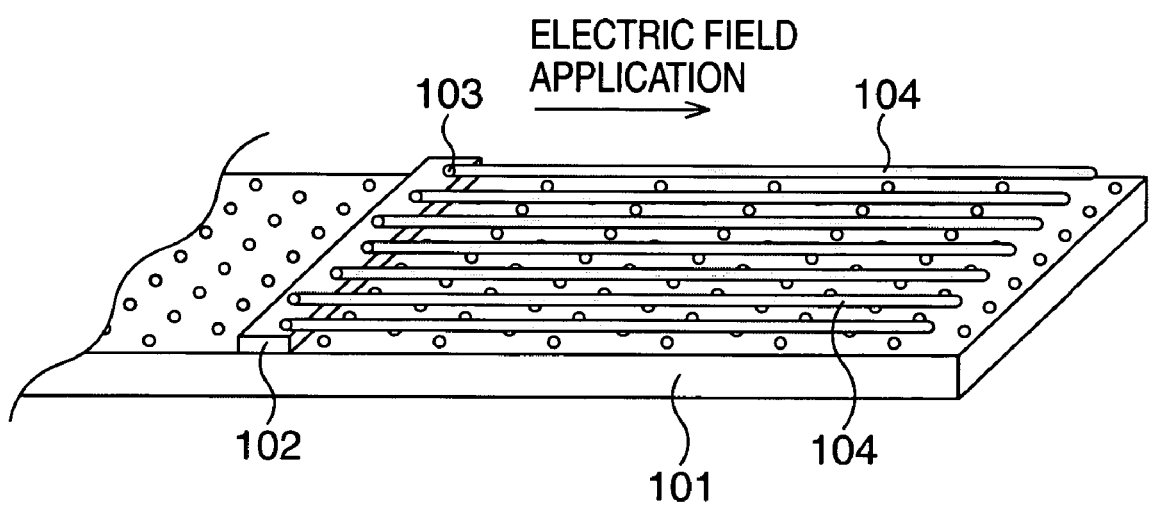

FIG. 13A and FIG. 13B are schematic perspective views showing main steps of a manufacturing method of a substrate structure according to the third embodiment.

In the beginning, as shown in FIG. 13A, a band-shaped Ti film 102 is formed, and Co particles 103 are scattered over the entire surface.

First, the Ti film 102 as a base film is deposited, for example, to have a thickness of approximately 1 nm on a silicon substrate 101, for example, by the sputtering method. This Ti film 102 is fabricated in a desired shape, in the example shown, in a band shape by photolithography and dry etching.

Incidentally, after an insulating film such as a silicon oxide film is formed on the entire surface of the silicon substrate 101, the Ti film 102 and so on may be formed on this insulating film.

Then, plural catalyst particles, here the Co particles 103 are formed on the entire surface of the silicon substrate 101 including a portion on the band-shaped Ti film 102 so as to have uniform particle size and scattered density, for example, by the laser ablation method described later. The respective Co particles 103 are formed to have each a particle size of approximately 1 nm, for example, at such a density as to adhere one by one onto the narrow band-shaped Ti film 102 in a longitudinal direction thereof.

Then, the Co particles 103 are subjected to CNT growth processing by the CVD method.

More specifically, by the thermal CVD method, the growth processing is executed with the growth temperature (environmental temperature in the CVD chamber) being set to a value within a range from 600° C. to 900° C., here approximately 800° C. while an electric field is applied horizontally to the surface of the substrate and in a direction orthogonal to the longitudinal direction of the Ti film 102. As a result, as shown in FIG. 13B, CNTs 104 grow selectively along the application direction of the electric field only from the Co particles 103 deposited on the Ti film 102 out of the Co particles 103 on the silicon substrate 101, and the substrate structure is completed. Due to the uniform particle size of the respective Co particles 103, the respective CNTs 104 come to have a uniform thickness, and due to the uniform scattered density of the respective Co particles 103 and the application of the electric field in the aforementioned direction, the respective CNTs 104 are formed in this direction at even intervals.

As described above, according to this embodiment, the Co particles 103 as the catalyst material are non-selectively scattered over the entire surface, whereby it becomes possible to easily and certainly grow the CNTs 104 in a predetermined region with any given shape/area on the silicon substrate 101 at even intervals and at a uniform thickness without damaging portions on the silicon substrate 1 and contaminating the Co particles 103, leading to the realization of the substrate structure which can be extensively applied to an electronic device and so on represented by a semiconductor device and so on.

Now, an example in which the aforementioned technical idea of the third embodiment is applied to a transistor structure will be described.

Figure 14A:
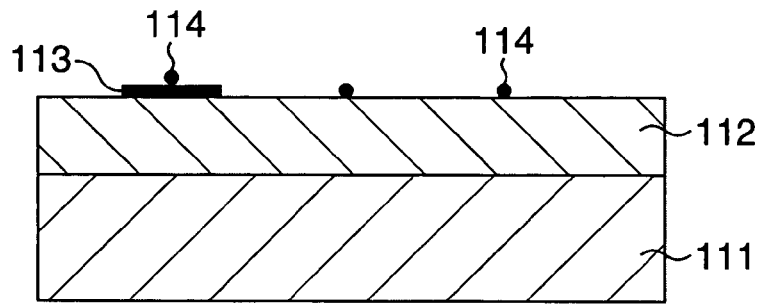
FIG. 14A to FIG. 14D are schematic sectional views showing main steps of a manufacturing method of a transistor structure according to the third embodiment.
Figure 14B:
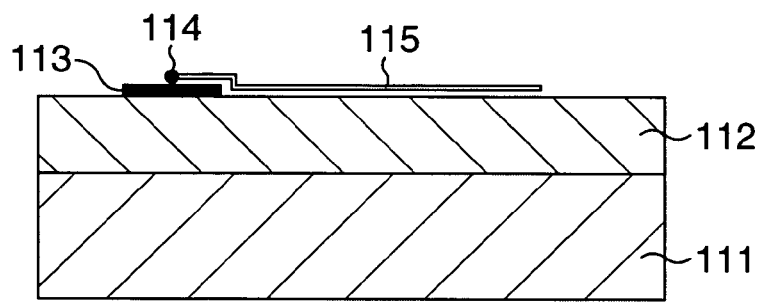
Figure 14C:
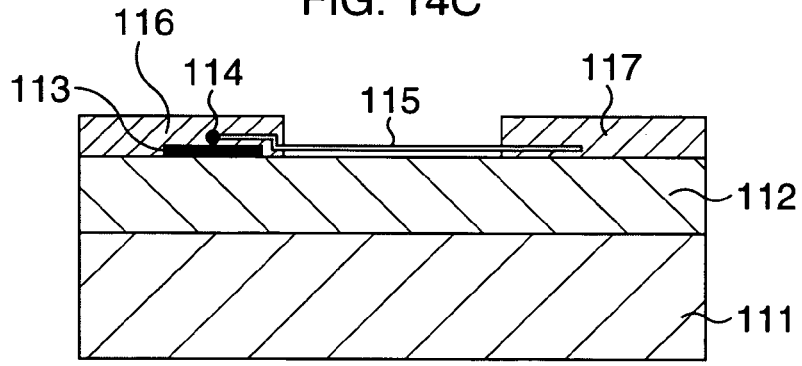
Figure 14D:
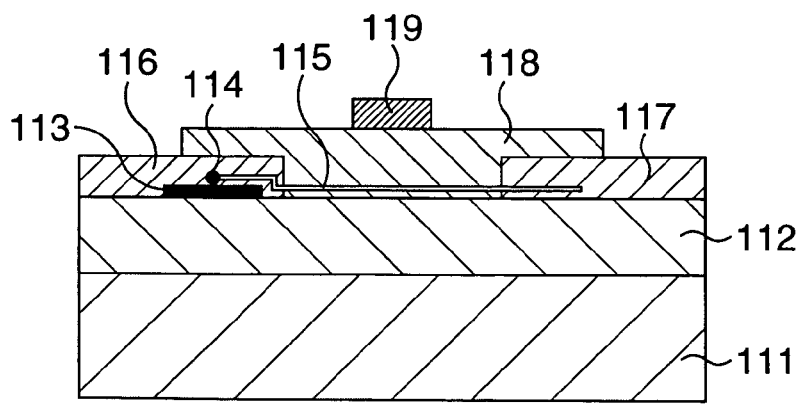
Figure 15:
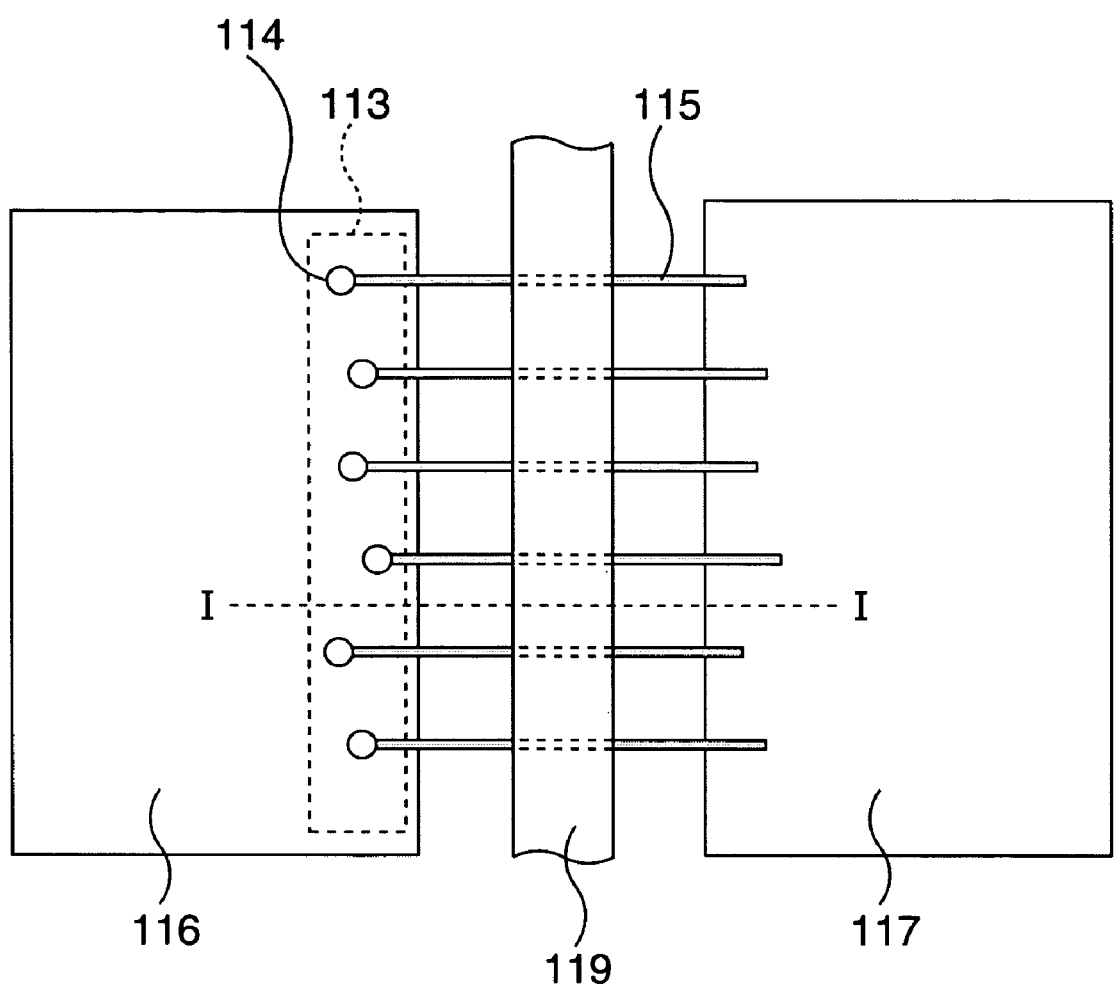
FIG. 15 is a schematic plan view corresponding to FIG. 14D.

FIG. 14A to FIG. 14D are schematic sectional views showing main steps of a manufacturing method of a transistor structure according to the third embodiment, and FIG. 15 is a schematic plan view corresponding to FIG. 14D. A section taken along the broken line I-I in FIG. 15 corresponds to FIG. 14D.

In the beginning, as shown in FIG. 14A, a band-shaped guide 113 made of a base film is formed, and Co particles 114 are scattered over the entire surface.

First, an insulating film, here a silicon oxide film 112 is formed to have a thickness of approximately 350 nm on a silicon substrate 111 by a thermal oxidation method.

Then, after a resist film (not shown) is applied onto the entire surface of the silicon oxide film 112, the resist film is patterned so that an opening to expose only a region intended as a guide on the silicon oxide film 112 is formed in the resist film. Thereafter, by the sputtering method or a deposition method, a film which becomes a base film, here, for example, a Ti film (not shown) is deposited to have a thickness of approximately 6 nm on the entire surface on the resist film including the interior of the opening. Then, by a lift-off method, the resist film and the Ti film deposited thereon are removed, and the band-shaped guide 113 is formed while the Ti film is left only in the aforementioned intended region.

Subsequently, plural catalyst particles, here, Co particles 114 are formed so as to have uniform particle size and scattered density on the entire surface of the silicon oxide film 112 including a portion on the band-shaped Ti film 113. The respective Co particles 114 are formed to have each a particle size of approximately 1 nm, for example, at such a density as to adhere one by one onto the narrow band-shaped guide 113 in a longitudinal direction thereof.

Figure 16:
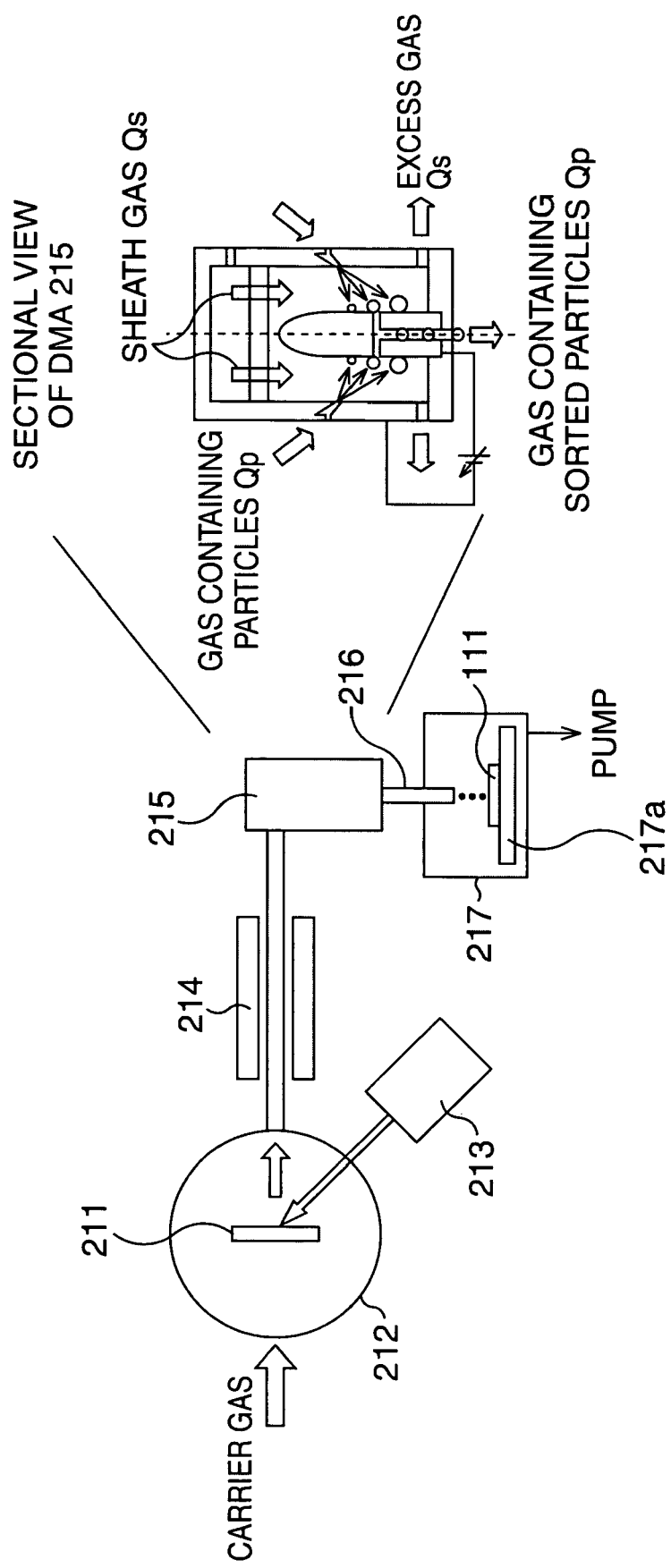
FIG. 16 is a diagrammatic sketch showing a schematic configuration of a catalyst particle generating system used in the third embodiment.

More specifically, using a catalyst particle generating system shown in FIG. 16, the Co particles 114 are generated by the laser ablation method which is a so-called dry method.

This catalyst particle generating system includes a chamber 212 in which a target, here, a Co target 211 is placed, a laser 213 which irradiates a laser beam to the Co target 211, an electric furnace 214 which anneals generated particles, a differential mobility analyzer (DMA) 215 which sorts particles according to their sizes, a nozzle 216 which supplies the Co particles 114 generated in the DMA 215, and a deposition chamber 217 in which an object on which the Co particles 114 are to be deposited, here, the silicon substrate 111 is fixedly mounted on a movable stage 117a.

In the DMA 215, a gas Qp containing the particles annealed by the electric furnace 214 is guided thereto by a sheath gas Qs, and only particles with a prescribed uniform size are sorted out, allowed to pass therethrough and supplied from the nozzle 216. The sheath gas Qs is exhausted as an excess gas.

First, the pressure in the chamber 212 is adjusted at approximately 1.3 kPa, and the laser beam is irradiated to the Co target 211 from the laser 213, for example, which is a second-harmonic Nd:YAG laser at a repetition frequency of 20 Hz. The Co target 211 is hit by the irradiation of the laser beam to generate vapor. This vapor is cooled by a carrier gas (He) at a flow rate of 1 slpm (standard liter per minute) to generate particles. Thereafter, these particles are annealed at approximately 1000° C. in the tube-type electric furnace 214, and then only particles with a size of 1 nm±10% are sorted out by the DMA 215. The Co particles 114 having a uniform size are led to the deposition chamber 217 which is maintained at a pressure of approximately 800 Pa by a pump through the nozzle 216, for example, with an inner diameter of approximately 4 nm. Immediately below the nozzle 216, the silicon substrate 111 is fixed on the movable stage 217a in the deposition chamber 217, and the Co particles 114 are deposited by an electric field, inertia, or diffusion. On this occasion, by scanning the movable stage 217a on which the silicon substrate 111 is mounted properly at a fixed scan speed, the Co particles 114 can be deposited at a uniform scattered density on the entire surface over the insulating film 112 including a portion on the guide 113.

Incidentally, when the Co particles 114 are generated, an inverse micelle method which is a so-called wet method may be used in place of the laser ablation method which is the dry method.

Subsequently, the Co particles 114 is subjected to CNT growth processing by the CVD method.

More specifically, by the thermal CVD method, acetylene (or metal or alcohol) or a mixed gas of acetylene or the like and hydrogen, for example, as a reactive gas is introduced into a vacuum chamber of a CVD device, the pressure is set at approximately 200 Pa, and the growth temperature (environmental temperature in the CVD chamber) is set at a value within a range from 600° C. to 900° C., here approximately 900° C. Further, the growth processing is executed while the direct-current (DC) or alternating-current (AC) electric field is applied horizontally to the surface of the substrate and in a direction orthogonal to the longitudinal direction of the guide 113. As a result, as shown in FIG. 14B, CNTs 115 grow selectively along the application direction of the electric field only from the Co particles 114 deposited on the guide 113 out of the Co particles 114 on the silicon oxide film 112, and a substrate structure is completed. Incidentally, in FIG. 14B, for convenience of illustration, only the Co particle 114 deposited on the guide 113 is shown. This goes for FIG. 14C and FIG. 14D, too. Due to the uniform particle size of the respective Co particles 114, the respective CNTs 115 come to have a uniform thickness, and due to the uniform scattered density of the respective Co particles 114 and the application of the electric field in the aforementioned direction, the respective CNTs 115 are formed in this direction at even intervals. These CTNs 115 function as a channel region of the transistor structure.

When the CNTs 115 are formed, a thermal filament CVD method of dissociating gas by a thermal filament may be used in place of the thermal CVD method. In this case, acetylene (or metal or alcohol) or a mixed gas of acetylene or the like and hydrogen, for example, as a reactive gas is introduced into the vacuum chamber, the pressure is set at approximately 1000 Pa, the growth temperature (environmental temperature in the CVD chamber) is set at approximately 600° C., and the thermal filament temperature is set at approximately 1800° C. Further, the growth processing is executed while the direct-current (DC) or alternating-current (AC) electric field is applied horizontally to the surface of the substrate and in a direction orthogonal to the longitudinal direction of the guide 113.

Subsequently, as shown in FIG. 14C, a source electrode 116 and a drain electrode 117 are formed.

After a resist film (not shown) is applied onto the entire surface of the silicon oxide film 112 including portions on the guide 113 and the CNTs 115, the resist film is patterned to form openings only in regions intended as the source electrode and the drain electrode. The region intended as the source electrode includes the guide 113. Thereafter, by the sputtering method or the deposition method, a metal film, here, a three-layer metal film (not shown) composed of Ti (approximately 10 nm in thickness)/Pt (approximately 10 nm in thickness)/Au (approximately 300 nm in thickness) is deposited on the entire surface on the resist film including the interiors of the respective openings. In place of the three-layer metal film, a metal film containing at least one kind of Pd, Mo, and Cu may be formed. Then, by the lift-off method, the resist film and the three-layer metal film deposited thereon are removed, and the source electrode 116 and the drain electrode 117 are formed while the three-layer metal film is left only in the aforementioned intended regions. The guide 113, the Co particles 114, and one end of each of the CNTs 115 are embedded in the source electrode 116, and the other end of each of the CNTs 115 is embedded in the drain electrode 116. Namely, the respective CNTs 115 with a uniform thickness act as bridges between the source electrode 116 and the drain electrode 117 at even intervals. Incidentally, in the example shown, the source electrode 116 and the drain electrode 116 are described as a one-layer film.

Thereafter, as shown in FIG. 14D and FIG. 15, a gate electrode 119 is pattern-formed with a gate insulating film 118 in between. Incidentally, for convenience of illustration, in FIG, 15, the gate insulating film 118 is not shown.

First, after a resist film (not shown) is applied onto the entire surface so as to cover the source electrode 116, the drain electrode 117, and the CNTs 115, the resist film is patterned to form an opening only in a region intended as the gate insulating film. Thereafter, by the CVD method or the like, an insulating film, here, a silicon oxide film (not shown) is deposited to have a thickness of approximately 10 nm using a TEOS material on the entire surface on the resist film including the interior of the opening. Incidentally, in place of the silicon oxide film, an insulating film having a high dielectric constant such as a $TiO_2$ film or a STO film may be formed. By using these insulating films as the material for the gate insulating film, excellent transistor characteristics can be obtained. Then, by the lift-off method, the resist film and the silicon oxide film deposited thereon are removed, and the gate insulating film 118 is formed while the silicon oxide film is left only in the aforementioned intended region. The gate insulating film 118 is formed in such a shape as to cover the respective CNTs 115 which becomes the channel region from one end of the source region 116 to one end of the drain region 117.

Then, after a resist film (not shown) is applied onto the entire surface including a portion on the gate insulating film 118, the resist film is patterned to form an opening only in a region intended as the gate electrode. Thereafter, by the sputtering method or the deposition method, a metal film, here, a three-layer metal film (not shown) composed of Ti (approximately 10 nm in thickness)/Pt (approximately 10 nm in thickness)/Au (approximately 300 nm in thickness) is deposited on the entire surface on the resist film including the interior of the opening. In place of the three-layer metal film, a metal film containing at least one kind of Al, Mo, W, and Cu may be formed. Then, by the lift-off method, the resist film and the three-layer metal film deposited thereon are removed, and the gate electrode 119 is formed while the three-layer metal film is left only in the aforementioned intended region. The gate electrode 119 is formed on the gate insulating film 118 in a band shape orthogonal to the longitudinal direction of the respective CNTs 115 thereunder, in other words, parallel to the longitudinal direction of the guide 113.

Thereafter, through the formation of the interlayer insulating film, connection holes, various kinds of wirings, and so on which are not shown, the transistor structure in which the channel region is constructed by the respective CNTs 115 which act as bridges between the source electrode 116 and the drain electrode 117 and the gate electrode 119 is pattern-formed with the gate insulating film 118 in between is completed.

Here, as a comparative example of the transistor structure according to this embodiment, the technique of Patent Document is given. In this technique, by forming catalyst films 150 thin (at thicknesses approximately from 2 nm to 5 nm) on a catalyst carrier film 104, the catalyst films 150 can be formed in such a manner as to be scattered on the catalyst film 150, and FIG. 17 shows explicitly a state in which the catalyst films 150 with different particle sizes are scattered. Namely, the technique of Patent Document 5 discloses that by forming the catalyst films 150 extremely thin, the catalyst films 150 can be formed in such a manner as to be scattered only on the catalyst carrier film 104, and is unconcerned about their particle sizes. This is obvious from FIG. 17, and the sizes of the catalyst films 150 are not uniform. When CNTs are grown in this state, it is impossible to control the thickness of the CNTs and so on.

On the other hand, in this embodiment, to borrow the expression of Patent Document 5, without devising the formation of the catalyst films only on the catalyst carrier film, using CNT's property of growing only from the catalyst particles (Co particles 114) on the base film (guide 113), so to speak, changing the way of thinking, the Co particles 114 are deposited on the entire surface including the portion on the guide 113. Moreover, in this case, in consideration of the control of transistor characteristics, the Co particles 114 are deposited so that both particles sizes and scattered density are made uniform.

As just described, this embodiment not only obviously differs from the technique of Patent Document 5 in configuration, but also produces an excellent effect which the technique of Patent Document 5 does not have, and hence both are separate inventions.

As described above, according to the transistor structure of this embodiment, the Co particles 114 as the catalyst material are non-selectively scattered over the entire surface, whereby it becomes possible to easily and certainly grow the respective CNTs 115 in a predetermined region with any given shape/area on the silicon substrate 111 at even intervals and at a uniform thickness without contaminating the Co particles 114. The CNTs 115 can be formed with good controllability as bridges between the source electrode 116 and the drain electrode 117, whereby desired transistor characteristics can be obtained, leading to the realization of the transistor structure with high reliability using the CNTs as the channel region.

Comparative Example

Various modified examples of the third embodiment will be described below. In these modified examples, similarly to the third embodiment, a substrate structure with its manufacturing method will be disclosed, but the aspect of formation of catalyst particles from which CNTs grow is different from that in the third embodiment. Incidentally, the same numerals and symbols are used to designate the same components and so on as those in the third embodiment.

Modified Example 1

Figure 17A:
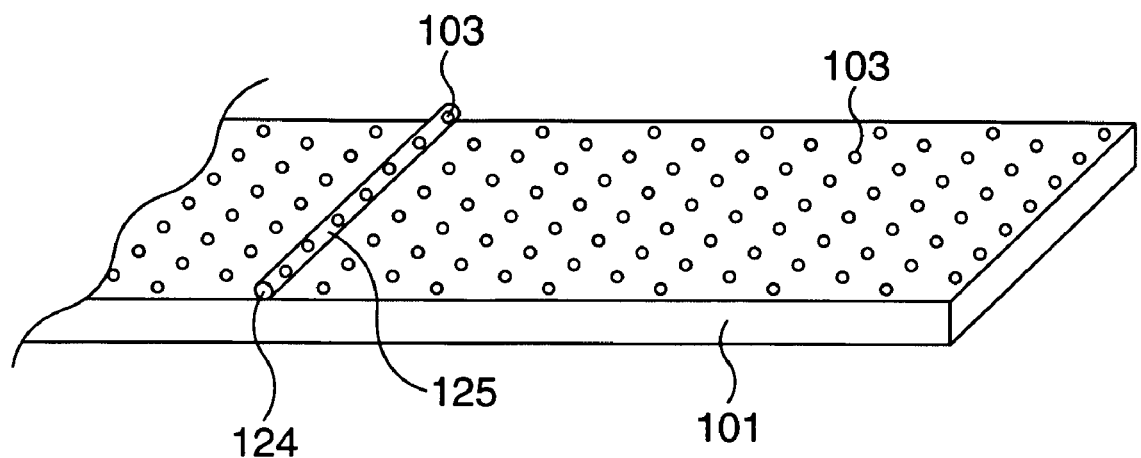
FIG. 17A and FIG. 17B are schematic perspective views showing main steps of a manufacturing method of a substrate structure according to a modified example 1 of the third embodiment.
Figure 17B:
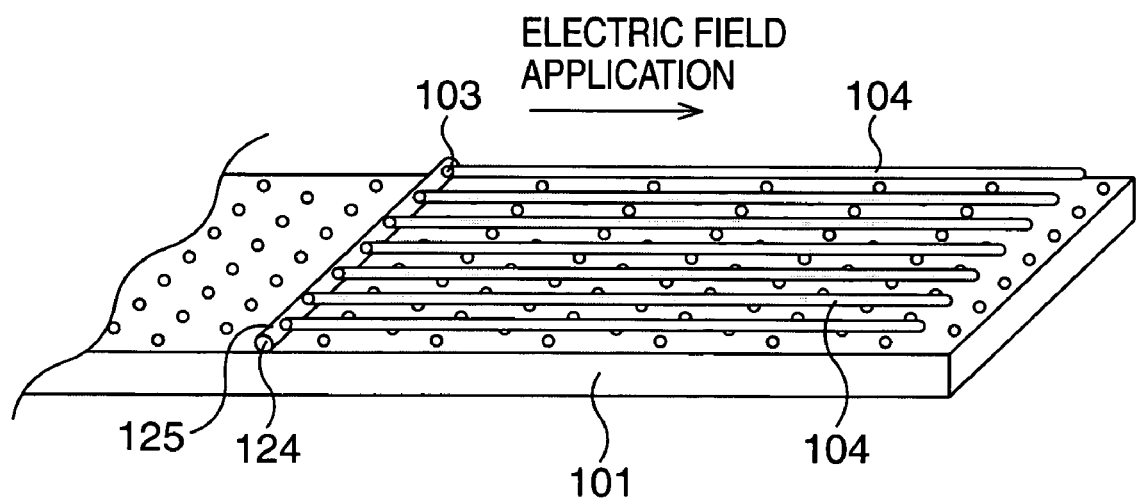

FIG. 17A and FIG. 17B are schematic perspective views showing main steps of a manufacturing method of a substrate structure according to the modified example 1 of the third embodiment.

In the beginning, after a CNT (basic CNT 125) which becomes a base is formed, the Co particles 103 are formed.

First, a catalyst particle, here a Co particle 124 is formed on the silicon substrate 101, for example, by the laser ablation method. Here, the Co particle 124 is formed to have a relatively large particle size, for example, approximately 5 nm, and ideally, only one Co particle 124 is required to be formed in a portion where the plural CNTs 104 described later are formed on the silicon substrate 101. For example, the laser ablation method is performed with such an adjustment that one Co particle 124 is substantially formed in the portion where the plural CNTs 104 are formed on the silicon substrate 101 at an extremely low scattered density.

Then, the Co particle 124 is subjected to CNT growth processing by the thermal CVD method to form the basic CNT 125 from the Co particle 124. This basic CNT 125 depends on the particle size of the Co particle 124, and it is formed thicker than the CNTs 104 described later.

Incidentally, after an insulating film such as a silicon oxide film is formed on the entire surface of the silicon substrate 101, the Ti film 102 and the like may be formed on this insulating film.

Thereafter, plural catalyst particles, here, the Co particles 103 are formed on the basic CNT 125 so as to have uniform particle size and scattered density, for example, by the laser ablation method. For example, by negatively charging the CNT 125 and positively charging the Co particles 103 so that the Co particles 103 adhere only onto the basic CNT 125 without adhering onto the silicon substrate 101 and scattering the Co particles 103 over the entire surface of the silicon substrate 101 including a portion on the basic CNT 125, the Co particles 103 are formed only on the basic CNT 125. On this occasion, the Co particles 103 have each, for example, a particle size of approximately 1 nm, and adhere onto the basic CNT 125 at even intervals in the longitudinal direction thereof.

Incidentally, after an insulating film such as a silicon oxide film is formed on the entire surface of the silicon substrate 101, the Ti basic CNT 125 and the like may be formed on this insulating film.

Subsequently, as shown in FIG. 17B, the Co particles 103 is subjected to CNT growth processing by the CVD method. Incidentally, the step in FIG. 17B is the same as the step in FIG. 13B in the third embodiment, so that the explanation thereof is omitted.

As a result, the CNTs 104 grow selectively along the application direction of the electric field from the Co particles 103 on the basic CNT 125, and the substrate structure is completed. Due to the uniform particle size of the respective Co particles 103, the respective CNTs 104 come to have a uniform thickness, and due to the uniform scattered density of the respective Co particles 103 and the application of the electric field in the aforementioned direction, the respective CNTs 104 are formed in this direction at even intervals.

As described above, according to the modified example 1, the Co particles 103 as the catalyst material are non-selectively scattered over the entire surface, whereby it becomes possible to easily and certainly grow the CNTs 104 in a predetermined region with any given shape/area on the silicon substrate 101 at even intervals and at a uniform thickness without contaminating the Co particles 103, leading to the realization of the substrate structure which can be extensively applied to an electronic device and so on represented by a semiconductor device and so on.

Now, an example in which the aforementioned technical idea of the modified example 1 of the third embodiment is applied to a transistor structure will be described.

Figure 18A:
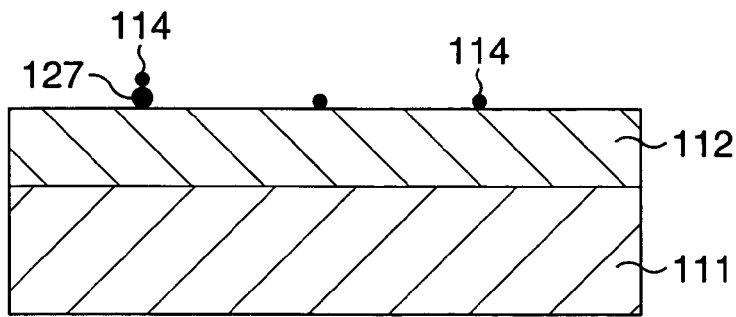
FIG. 18A to FIG. 18D are schematic sectional views showing main steps of a manufacturing method of a transistor structure according to the modified example 1 of the third embodiment.
Figure 18B:
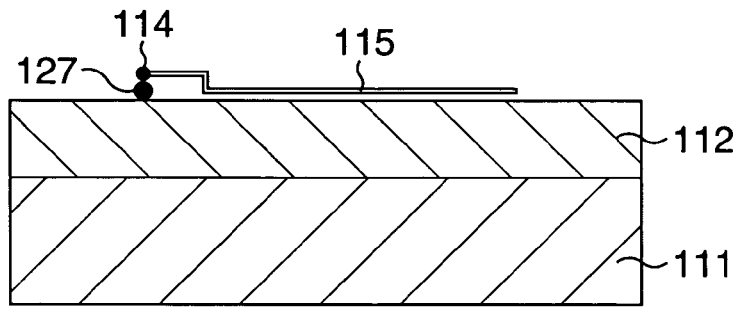
Figure 18C:
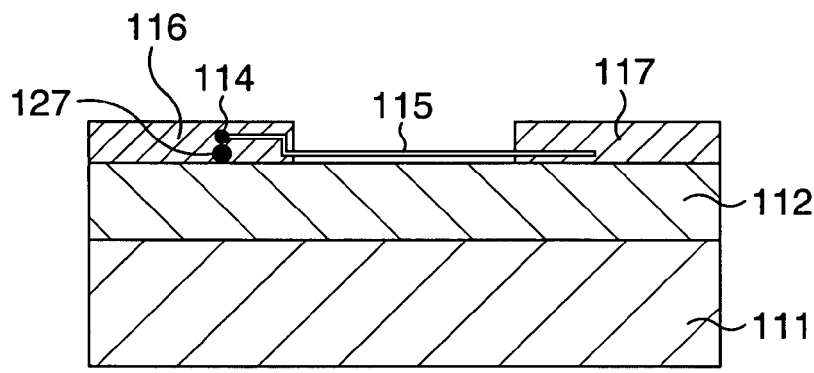
Figure 18D:
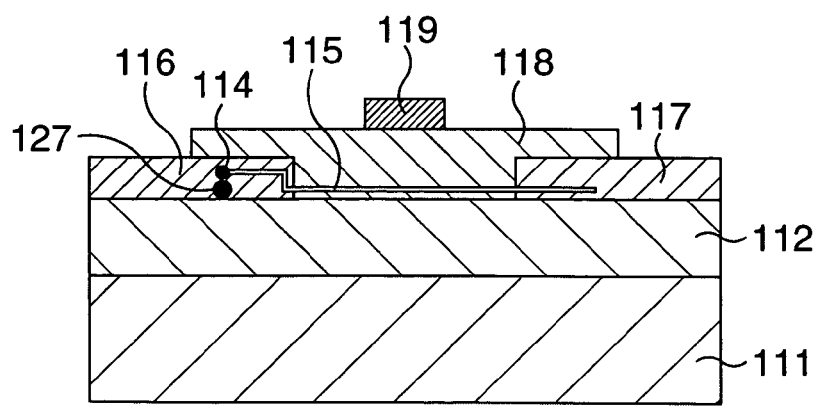
Figure 19:
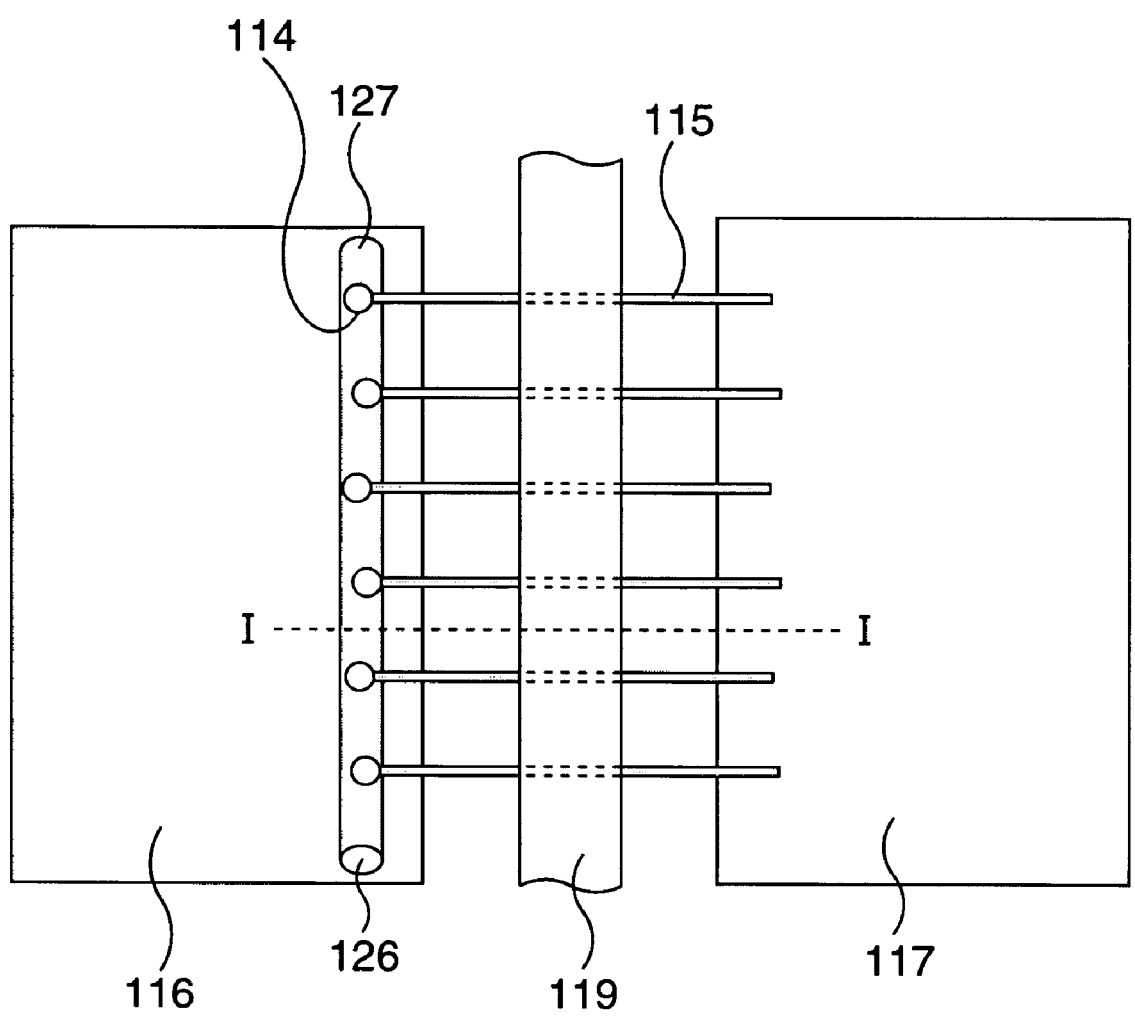
FIG. 19 is a schematic plan view corresponding to FIG. 18D.

FIG. 18A to FIG. 18D are schematic sectional views showing main steps of a manufacturing method of a transistor structure according to the modified example 1 of the third embodiment, and FIG. 19 is a schematic plan view corresponding to FIG. 18D. A section taken along the broken line I-I in FIG. 19 corresponds to FIG. 18D.

In the beginning, as shown in FIG. 18A, after a basic CNT 127 is formed, the Co particles 114 are scattered over the entire surface.

First, an insulating film, here the silicon oxide film 112 is formed to have a thickness of approximately 350 nm on the silicon substrate 111 by the thermal oxidation method.

Then, a catalyst particle, here a Co particle is formed on the silicon oxide film 112, for example, by the laser ablation method using the catalyst particle generating system in FIG. 16. For convenience of illustration, the Co particle is not depicted in FIG. 18A to FIG. 18D, but corresponds to a Co particle 126 in FIG. 19. Here, the Co particle 126 is formed to have a relatively large particle size, for example, approximately 5 nm, and ideally, only one Co particle 126 is required to be formed in a portion where plural CNTs 115 described later are formed on the silicon oxide film 112. For example, the laser ablation method is performed with such an adjustment that one Co particle 126 is substantially formed in the portion where the plural CNTs 115 are formed on the silicon substrate 101 at an extremely low scattered density.

Then, the Co particle 126 is subjected to CNT growth processing by the thermal CVD method to form the basic CNT 127 from the Co particle 126. This basic CNT 127 depends on the particle size of the Co particle 126 and it is formed thicker than the CNTs 115 described later.

Thereafter, plural catalyst particles, here, the Co particles 114 are formed on the basic CNT 127 so as to have uniform particle size and scattered density, for example, by the laser ablation method using the catalyst particle generating system in FIG. 16. For example, by negatively charging the basic CNT 127 and positively charging the Co particles 114 so that the Co particles 114 adhere only onto the basic CNT 127 without adhering onto the oxide film 112 and scattering the Co particles 114 over the entire surface of the silicon oxide film 112 including a portion on the basic CNT 127, the Co particles 114 are formed only on the basic CNT 127. On this occasion, the Co particles 114 have each, for example, a particle size of approximately 1 nm, and adhere onto the basic CNT 127 at even intervals in the longitudinal direction thereof.

Incidentally, when the Co particles 114 are generated, the inverse micelle method which is the so-called wet method may be used in place of the laser ablation method which is the dry method.

Subsequently, as shown in FIG. 18B, the Co particles 114 is subjected to CNT growth processing by the CVD method. Incidentally, the growth processing in FIG. 18B is the same as the step in FIG. 14B in the third embodiment, and hence the explanation thereof is omitted.

As a result of the execution of this growth processing, the CNTs 115 grow selectively along the application direction of the electric field from the Co particles 114 deposited on the basic CNT 127, and a substrate structure is completed. Due to the uniform particle size of the respective Co particles 114, the respective CNTs 115 come to have a uniform thickness, and due to the uniform scattered density of the respective Co particles 114 and the application of the electric field in the aforementioned direction, the respective CNTs 115 are formed in this direction at even intervals. These CTNs 115 function as a channel region of the transistor structure.

When the CNTs 115 are formed, the thermal filament CVD method of dissociating gas by a thermal filament may be used in place of the thermal CVD method as in the third embodiment.

Subsequently, as shown in FIG. 18C, the source electrode 116 and the drain electrode 117 are formed. Incidentally, the step in FIG. 18C is the same as the step in FIG. 14C in the third embodiment, so that the explanation thereof is omitted.

Then, as shown in FIG. 18D and FIG. 19, the gate electrode 119 is pattern-formed with the gate insulating film 118 in between, For convenience of illustration, the gate insulating film 118 is not shown in FIG. 19. Incidentally, the step in FIG. 18D is the same as the step in FIG. 14D in the third embodiment, so that the explanation thereof is omitted.

Thus, the transistor structure in which the channel region is constructed by the respective CNTs 115 which act as bridges between the source electrode 116 and the drain electrode 117 and the gate electrode 119 is pattern-formed with the gate insulating film 118 in between is completed.

As described above, according to the transistor structure of the modified example 1, the Co particles 114 as the catalyst material are non-selectively scattered over the entire surface, whereby it becomes possible to easily and certainly grow the CNTs 115 in a predetermined region with any given shape/area on the silicon substrate 111 at even intervals and at a uniform thickness without contaminating the Co particles 114. The CNTs 115 can be formed with good controllability as bridges between the source electrode 116 and the drain electrode 117, whereby desired transistor characteristics can be obtained, leading to the realization of the transistor structure with high reliability using the CNTs as the channel region.

Modified Example 2

Figure 20A:
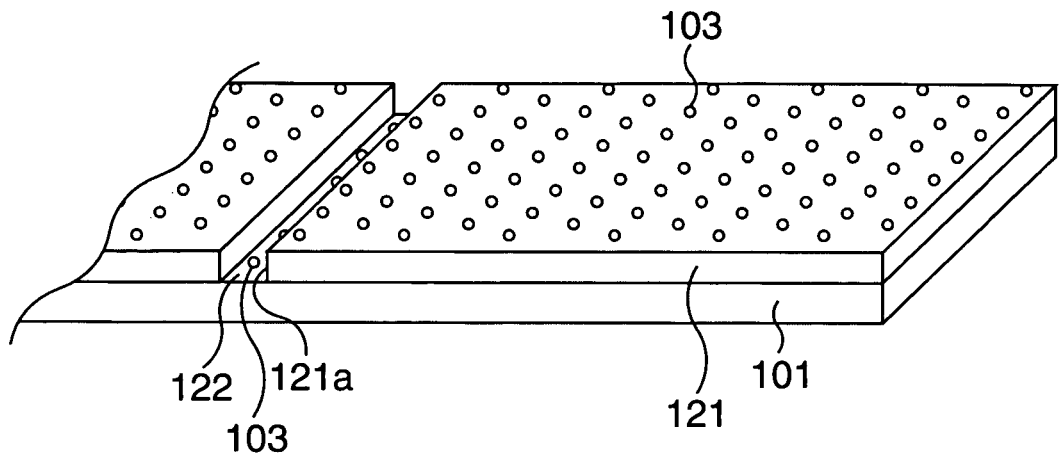
FIG. 20A to FIG. 20C are schematic perspective views showing main steps of a manufacturing method of a substrate structure according to a modified example 2 of the third embodiment.
Figure 20B:
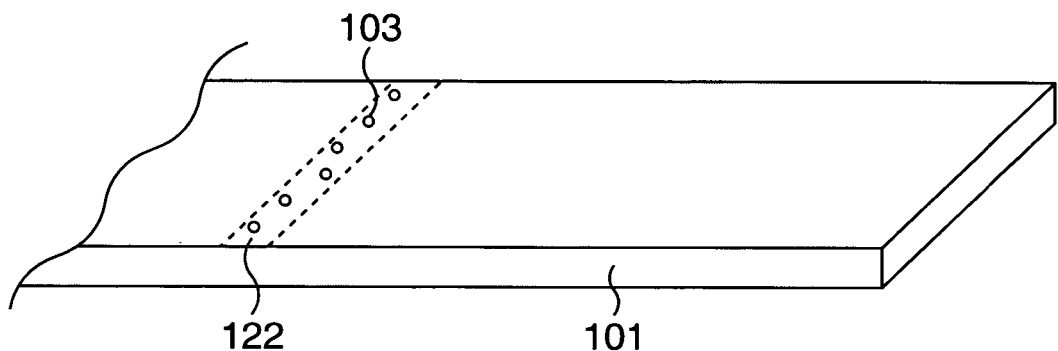
Figure 20C:
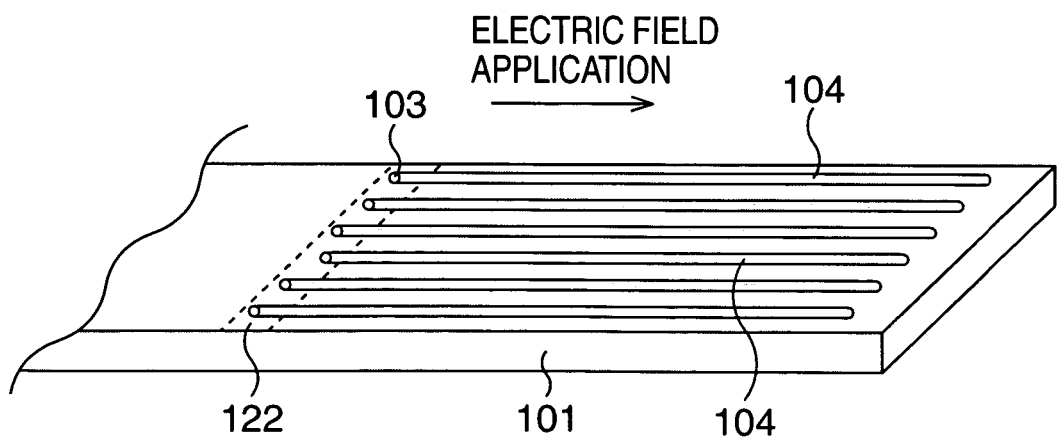

FIG. 20A to FIG. 20C are schematic perspective views showing main steps of a manufacturing method of a substrate structure according to the modified example 2 of the third embodiment.

In the beginning, as shown in FIG. 20A, a resist film 121 from which a particle deposition region 122 is exposed is formed and the Co particles 103 are scattered over the entire surface.

First, after the resist film 121 is applied onto the entire surface of the silicon substrate 121, the resist film 121 is patterned, and an opening 121a from which only a particle deposition region 122 on the silicon substrate 101 is exposed is formed in the resist film 121.

Then, with the resist film 121 as a mask, plural catalyst particles, here, the Co particles 103 are formed on the entire surface of the resist film including the interior of the opening 121a so as to have uniform particle size and scattered density, for example, by the laser ablation method. The respective Co particles 103 are formed to have each a particle size of approximately 1 nm, for example, at such a density as to adhere one by one onto the narrow band-shaped particle deposition region 122 specified by the opening 121a on the surface of the silicon substrate 101 in the longitudinal direction thereof.

Incidentally, after an insulating film such as a silicon oxide film is formed on the entire surface of the silicon substrate 101, the particle deposition region 122 and the like may be formed on this insulating film.

Subsequently, as shown in FIG. 20B, the resist film 121 and the Co particles 103 deposited thereon are removed by the lift-off method, and the Co particles 103 are left only on the particle deposition region 122.

Thereafter, as shown in FIG. 20C, the Co particles 103 are subjected to CNT growth processing by the CVD method. Incidentally, the step in FIG. 20C is the same as the step in FIG. 13B in the third embodiment, so that the explanation thereof is omitted.

As a result, the CNTs 104 grow selectively along the application direction of the electric field from the Co particles 103 deposited on the particle deposition region 122, and the substrate structure is completed. Due to the uniform particle size of the respective Co particles 103, the respective CNTs 104 come to have a uniform thickness, and due to the uniform scattered density of the respective Co particles 103 and the application of the electric field in the aforementioned direction, the respective CNTs 104 are formed in this direction at even intervals.

As described above, according to the modified example 2, the Co particles 103 as the catalyst material are non-selectively scattered over the entire surface, whereby it becomes possible to easily and certainly grow the CNTs 104 in a predetermined region with any given shape/area on the silicon substrate 101 at even intervals and at a uniform thickness without contaminating the Co particles 103 and pattern-forming a structure which becomes a guide, leading to the realization of the substrate structure which can be extensively applied to an electronic device and so on represented by a semiconductor device and so on.

Now, an example in which the aforementioned technical idea of the modified example 2 of the third embodiment is applied to a transistor structure will be described.

Figure 21A:
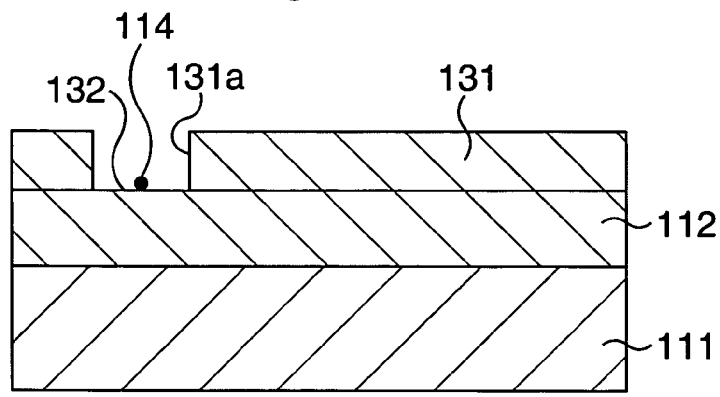
FIG. 21A to FIG. 21D are schematic sectional views showing main steps of a manufacturing method of a transistor structure according to the modified example 2 of the third embodiment.
Figure 21B:
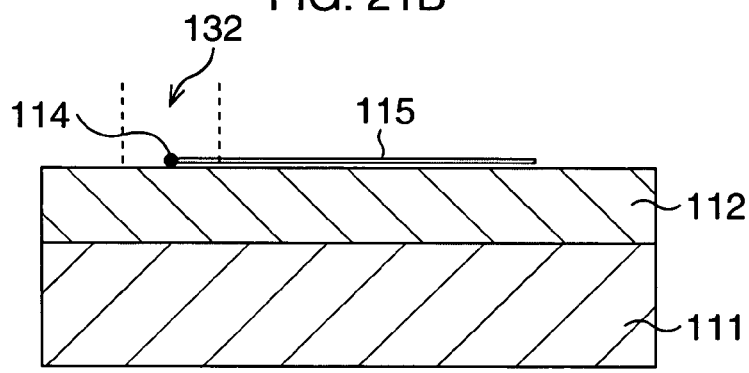
Figure 21C:
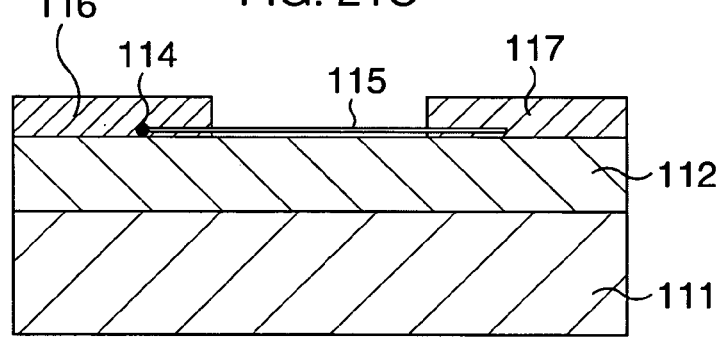
Figure 21D:
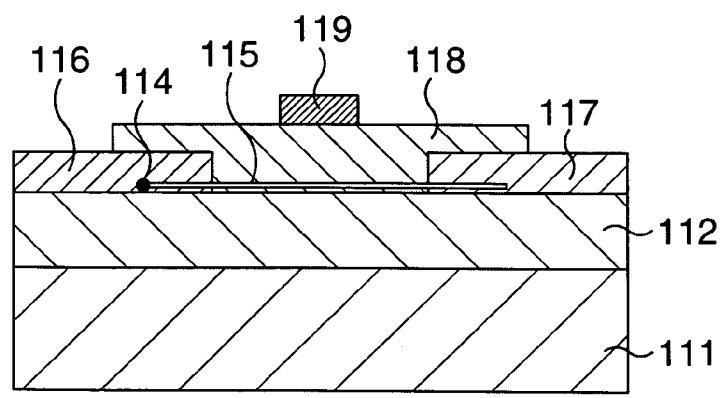
Figure 22:
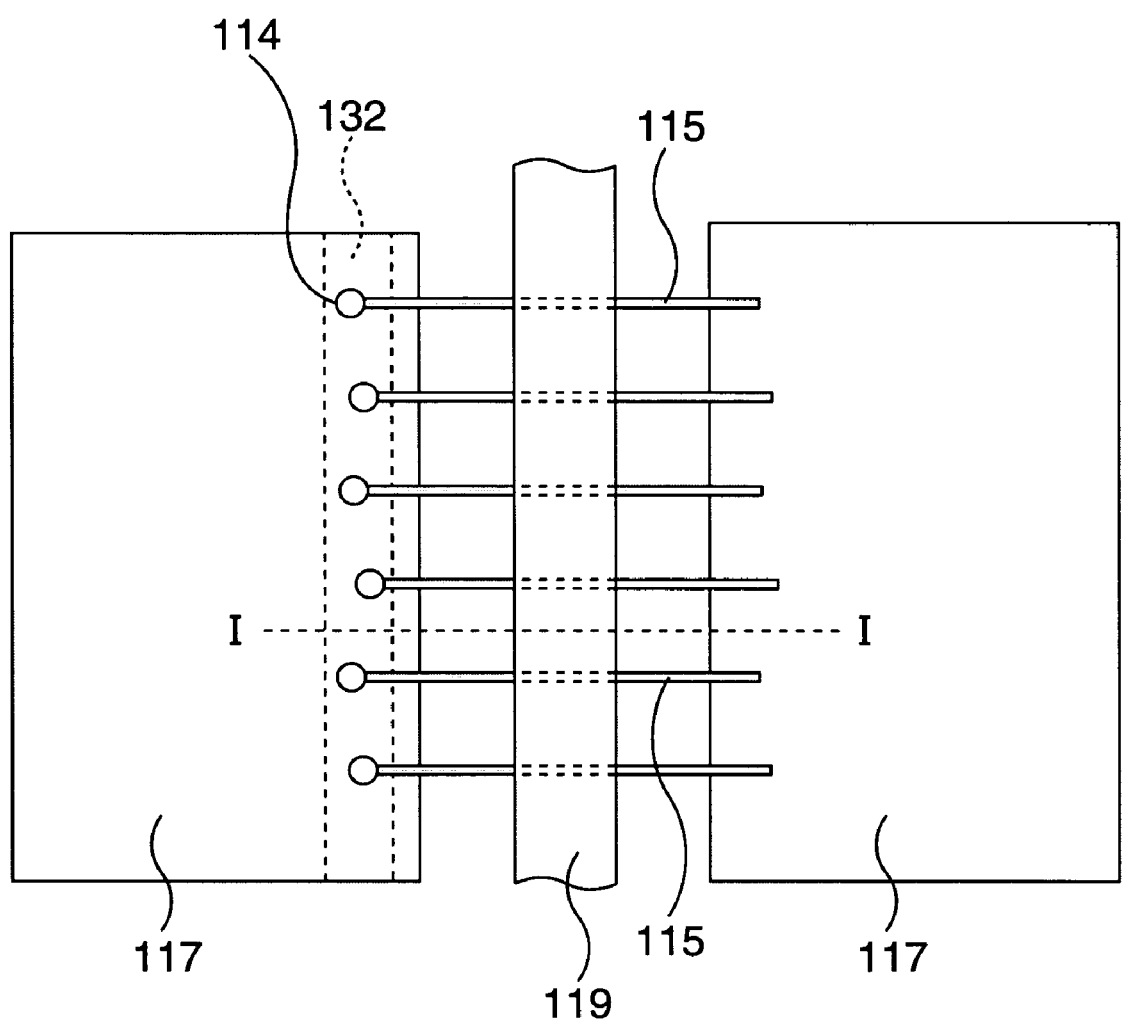
FIG. 22 is a schematic plan view corresponding to FIG. 21D.

FIG. 21A to FIG. 21D are schematic sectional views showing main steps of a manufacturing method of a transistor structure according to the modified example 2 of the third embodiment, and FIG. 22 is a schematic plan view corresponding to FIG. 21D. A section taken along the broken line I-I in FIG. 22 corresponds to FIG. 21D.

In the beginning, as shown in FIG. 21A, a resist film 131 from which a particle deposition region 132 is exposed is formed, and the Co particles 114 are scattered over the entire surface.

First, an insulating film, here, the silicon oxide film 112 is formed to have a thickness of approximately 350 nm on the silicon substrate 111 by the thermal oxidation method.

Then, after the resist film 131 is applied onto the entire surface of the silicon substrate 121, the resist film 131 is patterned, and an opening 131a from which only the particle deposition region 132 on the silicon oxide film 112 is exposed is formed in the resist film 131. Thereafter, with the resist film 131 as a mask, plural catalyst particles, here, the Co particles 114 are formed on the entire surface of the resist film 131 including the interior of the opening 132a so as to have uniform particle size and scattered density, for example, by the laser ablation method using the catalyst particle generating system in FIG. 16. The respective Co particles 114 are formed to have each a particle size of approximately 1 nm, for example, at such a density as to adhere one by one onto the narrow band-shaped particle deposition region 132 specified by the opening 131a on the surface of the silicon substrate 111 in the longitudinal direction thereof.

Incidentally, when the Co particles 114 are generated, the inverse micelle method which is the so-called wet method may be used in place of the laser ablation method which is the dry method.

Subsequently, as shown in FIG. 21B, the resist film 131 and the Co particles 114 deposited thereon are removed, and the Co particles 114 are left only on the particle deposition region 132.

Thereafter, as shown in FIG. 21B, the Co particles 114 are subjected to CNT growth processing by the CVD method. Incidentally, the growth processing in FIG. 21B is the same as the step in FIG. 14B in the third embodiment, and hence the explanation thereof is omitted.

As a result of the execution of this growth processing, the CNTs 115 grow selectively along the application direction of the electric field from the Co particles 114 deposited on the particle deposition region 132, and a substrate structure is completed. Due to the uniform particle size of the respective Co particles 114, the respective CNTs 115 come to have a uniform thickness, and due to the uniform scattered density of the respective Co particles 114 and the application of the electric field in the aforementioned direction, the respective CNTs 115 are formed in this direction at even intervals. These CTNs 115 function as a channel region of the transistor structure.

When the CNTs 115 are formed, the thermal filament CVD method of dissociating gas by a thermal filament may be used in place of the thermal CVD method as in the third embodiment.

Subsequently, as shown in FIG. 21C, the source electrode 116 and the drain electrode 117 are formed. Incidentally, the step in FIG. 21C is the same as the step in FIG. 14C in the third embodiment, so that the explanation thereof is omitted.

Then, as shown in FIG. 21D and FIG. 22, the gate electrode 119 is pattern-formed with the gate insulating film 118 in between. For convenience of illustration, the gate insulating film 118 is not shown in FIG. 22. Incidentally, the step in FIG. 21D is the same as the step in FIG. 14D in the third embodiment, so that the explanation thereof is omitted.

Thus, the transistor structure in which the channel region is constructed by the respective CNTs 115 which act as bridges between the source electrode 116 and the drain electrode 117 and the gate electrode 119 is pattern-formed with the gate insulating film 118 in between is completed.

As described above, according to the transistor structure of the modified example 2, the Co particles 114 as the catalyst material are non-selectively scattered over the entire surface, whereby it becomes possible to easily and certainly grow the CNTs 115 in a predetermined region with any given shape/area on the silicon substrate 111 at even intervals and at a uniform thickness without contaminating the Co particles 114 and pattern-forming a structure which becomes a guide. The CNTs 115 can be formed with good controllability as bridges between the source electrode 116 and the drain electrode 117, whereby desired transistor characteristics can be obtained, leading to the realization of the transistor structure with high reliability using the CNTs as the channel region.

Modified Example 3

Figure 23A:
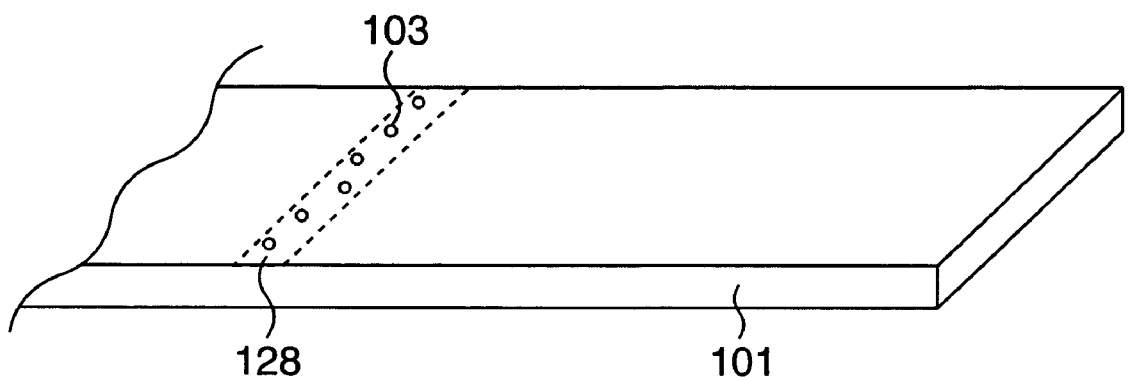
FIG. 23A and FIG. 23B are schematic perspective views showing main steps of a manufacturing method of a substrate structure according to a modified example 3 of the third embodiment.
Figure 23B:
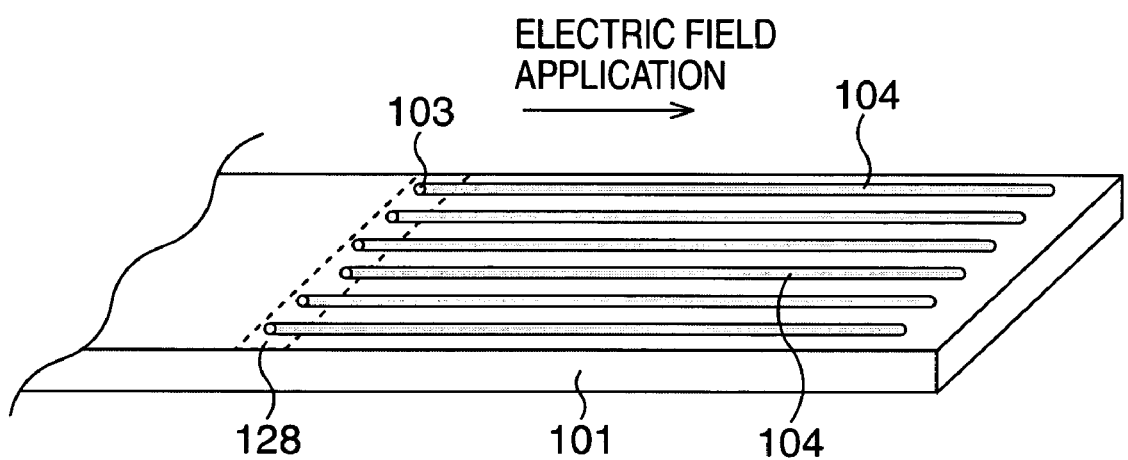

FIG. 23A and FIG. 23B are schematic perspective views showing main steps of a manufacturing method of a substrate structure according to the modified example 3 of the third embodiment.

In the beginning, as shown in FIG. 23A, an electrically charged region 128 is demarcated, and the Co particles 103 are scattered over the entire surface.

First, the electrically charged region 128 is demarcated on the silicon substrate 101. More specifically, a region intended for deposition of catalyst particles on the silicon substrate 101 is scanned, for example, using an electron beam (EB) lithography system and negatively charged to demarcate the electrically charged region 128.

Then, with the resist film 121 as a mask, plural catalyst particles, here, the Co particles 103 are formed on the entire surface of the resist film 121 including the interior of the opening 121a so as to have uniform particle size and scattered density, for example, by the laser ablation method. By positively charging the Co particles 103 at the time of the laser ablation method so that the Co particles 103 adhere only onto the electrically charged region 128 without adhering onto the silicon substrate 101 and scattering the Co particles 103 over the entire surface of the silicon substrate 101 including a portion on the electrically charged region 128, the Co particles 103 are formed only on the electrically charged region 128. The respective Co particles 103 are formed to have each a particle size of approximately 1 nm, for example, at such a density as to adhere one by one onto the narrow band-shaped electrically charged region 128 in the longitudinal direction thereof.

Incidentally, after an insulating film such as a silicon oxide film is formed on the entire surface of the silicon substrate 101, the electrically charged region 128 and the like may be formed on this insulating film.

Subsequently, as shown in FIG. 23B, the Co particles 103 are subjected to CNT growth processing by the CVD method. Incidentally, the step in FIG. 23B is the same as the step in FIG. 13B in the third embodiment, so that the explanation thereof is omitted.

As a result, the CNTs grow selectively along the application direction of the electric field from the Co particles 103 deposited on the electrically charged region 128, and the substrate structure is completed. Due to the uniform particle size of the respective Co particles 103, the respective CNTs 104 come to have a uniform thickness, and due to the uniform scattered density of the respective Co particles 103 and the application of the electric field in the aforementioned direction, the respective CNTs 104 are formed in this direction at even intervals.

As described above, according to the modified example 3, the Co particles 103 as the catalyst material are non-selectively scattered over the entire surface, whereby it becomes possible to easily and certainly grow the CNTs 104 in a predetermined region with any given shape/area on the silicon substrate 101 at even intervals and at a uniform thickness without contaminating the Co particles 103 and pattern-forming a structure which becomes a guide, leading to the realization of the substrate structure which can be extensively applied to an electronic device and so on represented by a semiconductor device and so on.

Now, an example in which the aforementioned technical idea of the modified example 3 of the third embodiment is applied to a transistor structure will be described.

Figure 24A:
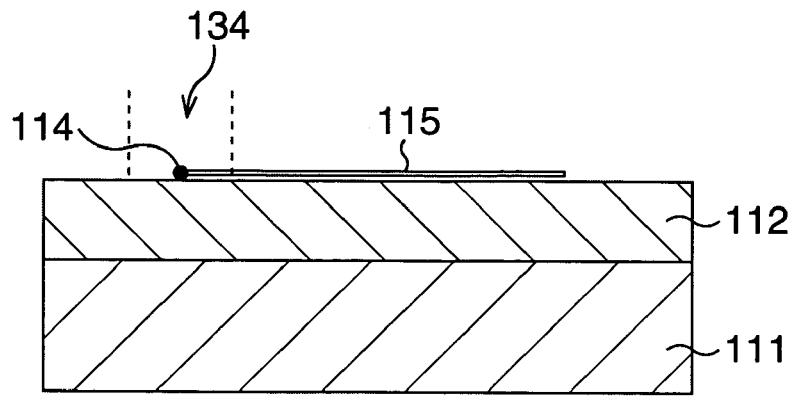
FIG. 24A to FIG. 24C are schematic sectional views showing main steps of a manufacturing method of a transistor structure according to the modified example 3 of the third embodiment.
Figure 24B:
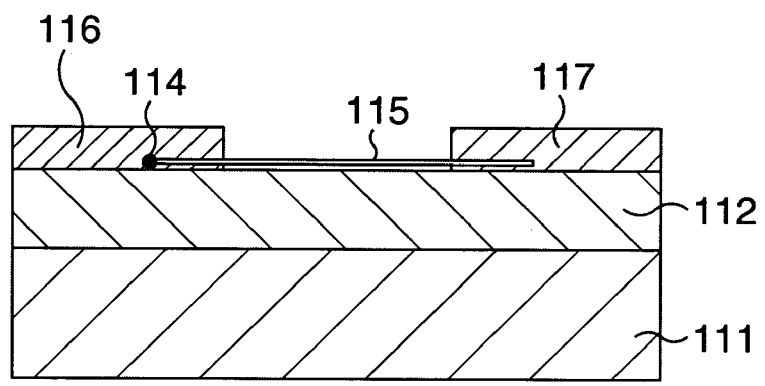
Figure 24C:
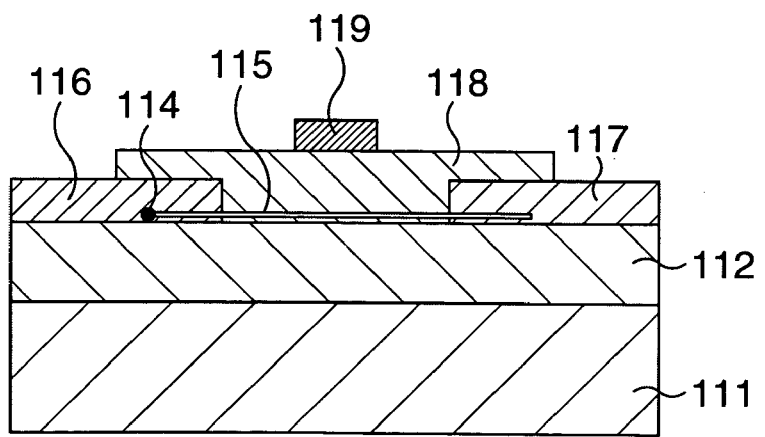
Figure 25:
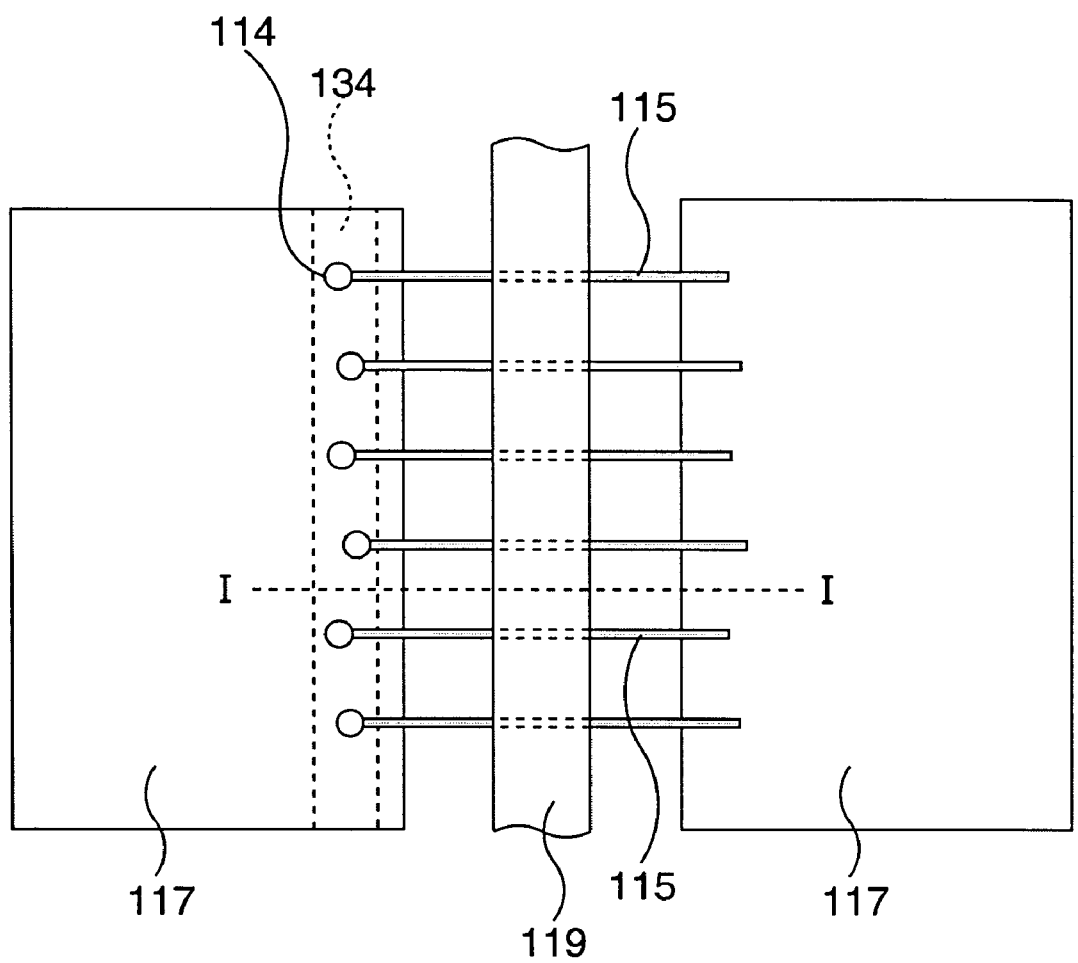
FIG. 25 is a schematic plan view corresponding to FIG. 24C.

FIG. 24A to FIG. 24C are schematic sectional views showing main steps of a manufacturing method of a transistor structure according to the modified example 3 of the third embodiment, and FIG. 25 is a schematic plan view corresponding to FIG. 24C. A section taken along the broken line I-I in FIG. 25 corresponds to FIG. 24C.

In the beginning, as shown in FIG. 24A, an electrically charge region 134 is demarcated, and the Co particles 114 are scattered over the entire surface.

First, an insulating film, here, the silicon oxide film 112 is formed to have a thickness of approximately 350 nm on the silicon substrate 111 by the thermal oxidation method.

Then, the electrically charged region 134 is demarcated on the silicon oxide film 112. More specifically, a region intended for deposition of catalyst particles on the silicon oxide film 112 is scanned, for example, using the electron beam (EB) lithography system and negatively charged to demarcate the electrically charged region 134.

Then, plural catalyst particles, here, the Co particles 114 are formed on the entire surface of the silicon oxide film 112 including a portion on the electrically charge region 134 so as to have uniform particle size and scattered density by the laser ablation method using the catalyst particle generating system in FIG. 16. Here, by positively charging the Co particles 114 at the time of the laser ablation method so that the Co particles 114 adhere only onto the electrically charged region 134 without adhering onto the silicon oxide film 112 and scattering the Co particles 114 over the entire surface of the silicon oxide film 112 including the portion on the electrically charged region 134, the Co particles 114 are formed only on the electrically charged region 134. The respective Co particles 114 are formed to have each a particle size of approximately 1 nm, for example, at such a density as to adhere one by one onto the narrow band-shaped electrically charged region 134 in the longitudinal direction thereof.

Incidentally, when the Co particles 114 are generated, the inverse micelle method which is the so-called wet method may be used in place of the laser ablation method which is the dry method.

Thereafter, as shown in FIG. 24A, the Co particles 114 are subjected to CNT growth processing by the CVD method. Incidentally, the growth processing in FIG. 24A is the same as the step in FIG. 14B in the third embodiment, and hence the explanation thereof is omitted.

As a result of the execution of this growth processing, the CNTs 115 grow selectively along the application direction of the electric field from the Co particles 114 deposited on the electrically charged region 134, and a substrate structure is completed. Due to the uniform particle size of the respective Co particles 114, the respective CNTs 115 come to have a uniform thickness, and due to the uniform scattered density of the respective Co particles 114 and the application of the electric field in the aforementioned direction, the respective CNTs 115 are formed in this direction at even intervals. These CTNs 115 function as a channel region of the transistor structure.

When the CNTs 115 are formed, the thermal filament CVD method of dissociating gas by a thermal filament may be used in place of the thermal CVD method as in the third embodiment.

Subsequently, as shown in FIG. 24B, the source electrode 116 and the drain electrode 117 are formed. Incidentally, the step in FIG. 24B is the same as the step in FIG. 14C in the third embodiment, so that the explanation thereof is omitted.

Then, as shown in FIG. 24C and FIG. 25, the gate electrode 119 is pattern-formed with the gate insulating film 118 in between. For convenience of illustration, the gate insulating film 118 is not shown in FIG. 25. Incidentally, the step in FIG. 24C is the same as the step in FIG. 14D in the third embodiment, so that the explanation thereof is omitted.

Thus, the transistor structure in which the channel region is constructed by the respective CNTs 115 which act as bridges between the source electrode 116 and the drain electrode 117 and the gate electrode 119 is pattern-formed with the gate insulating film 118 in between is completed.

As described above, according to the transistor structure of the modified example 3, the Co particles 114 as the catalyst material are non-selectively scattered over the entire surface, whereby it becomes possible to easily and certainly grow the respective CNTs 115 in a predetermined region with any given shape/area on the silicon substrate 111 at even intervals and at a uniform thickness without contaminating the Co particles 103 and pattern-forming a structure which becomes a guide. The CNTs 115 can be formed with good controllability as bridges between the source electrode 116 and the drain electrode 117, whereby desired transistor characteristics can be obtained, leading to the realization of the transistor structure with high reliability using the CNTs as the channel region.

According to the present invention, it becomes possible to easily and certainly grow CNTs in a predetermined region with any given shape/area on a substrate without patterning a catalyst material and therefore without damaging the other portions on the substrate and contaminating the catalyst material, leading to the realization of a substrate structure which can be extensively applied to various kinds of wirings, a heat release mechanism, and so on of an electronic device represented by a semiconductor device or the like.

Further, according to the present invention, the lengths of CNTs which grow can be easily controlled, and hence CNTs having different lengths can be formed at the same time in respective predetermined regions with any given shapes/areas on a substrate in a single growth processing process, which makes it possible to form, in various microfabrication portions such as various kinds of wiring trenches and connection holes having different sizes, CNTs which match these sizes in the fewest possible steps.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

What is claimed is:

1. A substrate structure, comprising:
   a substrate;
   a base film pattern-formed in a region on said substrate;
   a catalyst material deposited on an entire surface on said substrate so as to cover said base film and having a first portion formed on said base film and a second portion formed on said substrate; and
   a linear structure made of a carbon element and formed only on a portion corresponding to a portion on said base film of said catalyst material said first portion.

2. The substrate structure according to claim 1, wherein said catalyst material is formed in a film shape.

3. The substrate structure according to claim 1, wherein said catalyst material is deposited in a particle shape.

4. The substrate structure according to claim 1, wherein said base films with at least two different thicknesses are pattern-formed in plural portions on said substrate, and the thinner each of said base films, the longer said linear structure formed on the portion corresponding to the portion on said base film of said catalyst material becomes.

5. The substrate structure according to claim 1, wherein a plurality of said linear structures are formed so as to be densely arranged on the portion corresponding to the portion on said base film of said catalyst material.

6. The substrate structure according to claim 1, wherein said linear structure is formed so as to rise from the portion corresponding to the portion on said base film of said catalyst material.

7. The substrate structure according to claim 1, wherein said linear structure is formed so as to act as a bridge between portions corresponding to the portions on said base films adjacent to each other.

8. The substrate structure according to claim 6, wherein an insulating film having a recess is formed on said substrate, and said linear structure is formed so as to be embedded in the recess.

9. The substrate structure according to claim 8, wherein said base film and said catalyst material are formed on a bottom portion of the recess, and said linear structure is formed on the bottom portion.

10. The substrate structure according to claim 8, wherein said base film and said catalyst material are formed on a sidewall portion of the recess, and said linear structure is formed on the sidewall portion.

11. A substrate structure, comprising:
a substrate;
a base film pattern-formed in a region on said substrate;
plural catalyst particles deposited on an entire surface on said substrate including a portion on said base film so as to have uniform particle size and density and having a first portion formed on said base film and a second portion formed on said substrate; and
a linear structure made of a carbon element formed only on said catalyst particle which exists on said base film said first portion out of said plural catalyst particles.

12. The substrate structure according to claim 11, wherein said respective linear structures are formed from said respective particles deposited on said base film at even intervals and at a uniform thickness.

13. The substrate structure according to claim 12, further comprising a transistor structure, wherein
said base film is formed on a source electrode or a drain electrode,
a channel region is formed by said linear structures which are formed from said respective catalyst particles deposited on said base film at even intervals and at a uniform thickness so as to act as bridges between the source electrode and the drain electrode, and
a gate electrode is formed between the source electrode and the drain electrode on said linear structures with a gate insulating film in between.

* * * * *